US012685037B2

(12) United States Patent
Li et al.

(10) Patent No.: US 12,685,037 B2
(45) Date of Patent: Jul. 14, 2026

(54) PHASE CHANGE MATERIAL SWITCH WITH IMPROVED THERMAL DISSIPATION AND METHODS FOR FORMING THE SAME

(71) Applicant: Taiwan Semiconductor Manufacturing Company Limited, Hsinchu (TW)

(72) Inventors: Fu-Hai Li, Tainan City (TW); Yi Ching Ong, Hsinchu (TW); Kuo-Ching Huang, Hsinchu City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 438 days.

(21) Appl. No.: 18/303,692

(22) Filed: Apr. 20, 2023

(65) Prior Publication Data

US 2024/0099167 A1    Mar. 21, 2024

Related U.S. Application Data

(60) Provisional application No. 63/406,758, filed on Sep. 15, 2022.

(51) Int. Cl.
H10N 70/00      (2023.01)
H10N 70/20      (2023.01)

(52) U.S. Cl.
CPC ....... H10N 70/8613 (2023.02); H10N 70/011 (2023.02); H10N 70/231 (2023.02); H10N 70/823 (2023.02); H10N 70/8413 (2023.02); H10N 70/8828 (2023.02)

(58) Field of Classification Search
CPC ............. H10N 70/8613; H10N 70/011; H10N 70/823; H10N 70/8413; H10N 70/8828; H10N 70/231–235; H10B 63/00–845; G11C 11/5678; H01L 23/40–4093
See application file for complete search history.

(56) References Cited

U.S. PATENT DOCUMENTS

| | | | | |
|---|---|---|---|---|
| 9,368,720 | B1 * | 6/2016 | Moon | ................. H10N 70/8828 |
| 11,187,891 | B1 * | 11/2021 | Moon | ............... G02F 1/133553 |
| 2010/0289377 | A1 * | 11/2010 | Erbil | ...................... H10N 15/10 |
| | | | | 310/306 |
| 2011/0266516 | A1 * | 11/2011 | Park | ...................... H10B 63/82 |
| | | | | 438/54 |

(Continued)

*Primary Examiner* — Shahed Ahmed

(74) *Attorney, Agent, or Firm* — The Marbury Law Group, PLLC

(57) ABSTRACT

An embodiment phase change material (PCM) switch may include a PCM element having a first electrode and a second electrode, a heating element coupled to a first side of the PCM element, and a heat spreader formed on a second side of the PCM element opposite to the heating element. The PCM element may include a phase change material that switches from an electrically conducting phase to an electrically insulating phase by application of a heat pulse provided by the heating element. The first electrode, the second electrode, the PCM element, and the heat spreader may be configured as an RF switch that blocks RF signals when the phase change material element is the electrically insulating phase and conducts RF signals when the when the phase change material element is in the electrically conducting phase. The heat spreader may be electrically isolated from the heating element and the PCM element.

20 Claims, 29 Drawing Sheets

300

(56) References Cited

U.S. PATENT DOCUMENTS

| | | | |
|---|---|---|---|
| 2015/0372227 A1* | 12/2015 | Liu ........................ | H10B 63/80 |
| | | | 257/4 |
| 2023/0093604 A1* | 3/2023 | Ok ........................ | H10N 70/231 |
| | | | 257/4 |
| 2024/0069581 A1* | 2/2024 | Yarragunta ............. | G06F 1/206 |

* cited by examiner

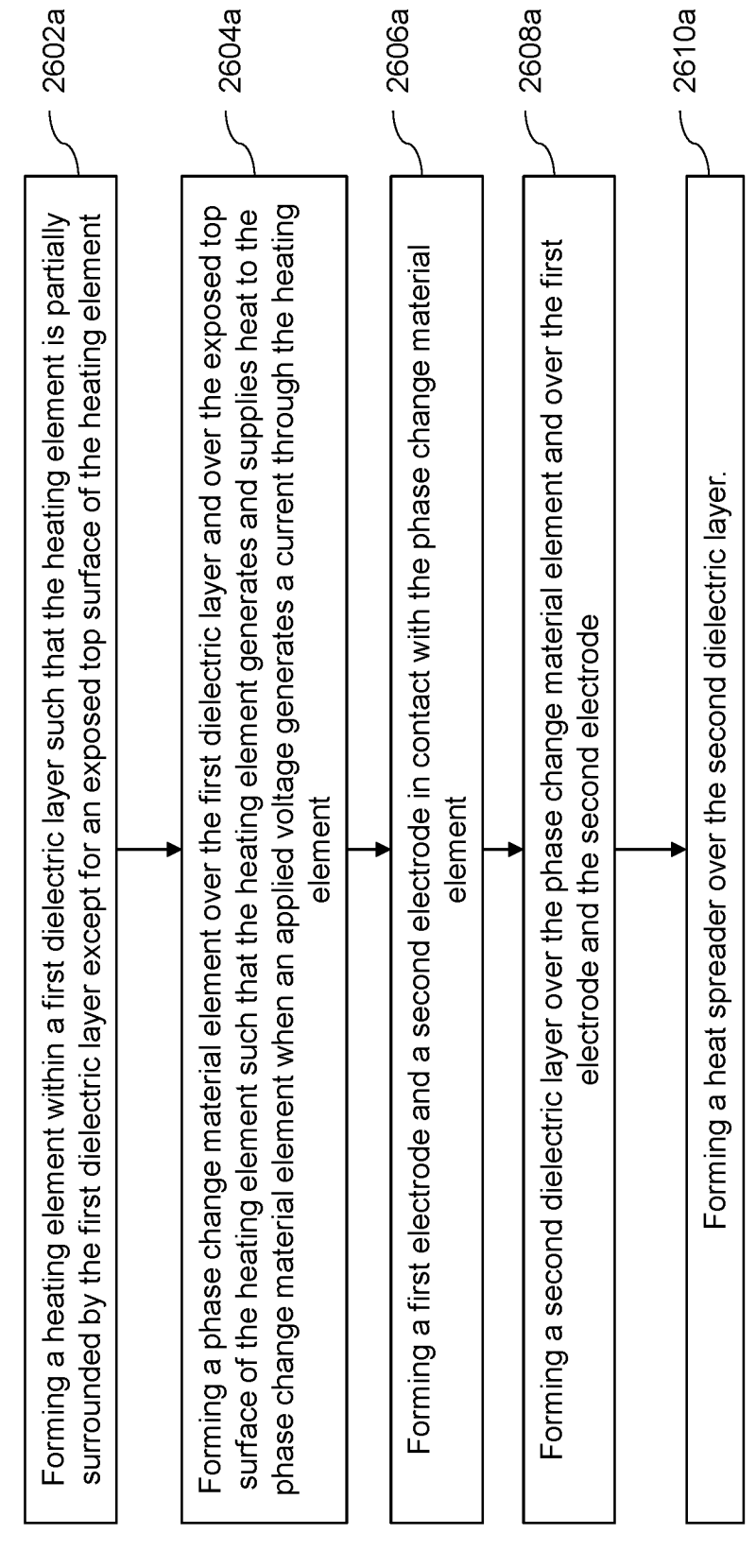

2600a

2602a — Forming a heating element within a first dielectric layer such that the heating element is partially surrounded by the first dielectric layer except for an exposed top surface of the heating element 2604a — Forming a phase change material element over the first dielectric layer and over the exposed top surface of the heating element such that the heating element generates and supplies heat to the phase change material element when an applied voltage generates a current through the heating element 2606a — Forming a first electrode and a second electrode in contact with the phase change material element 2608a — Forming a second dielectric layer over the phase change material element and over the first electrode and the second electrode 2610a — Forming a heat spreader over the second dielectric layer.

FIG. 26A

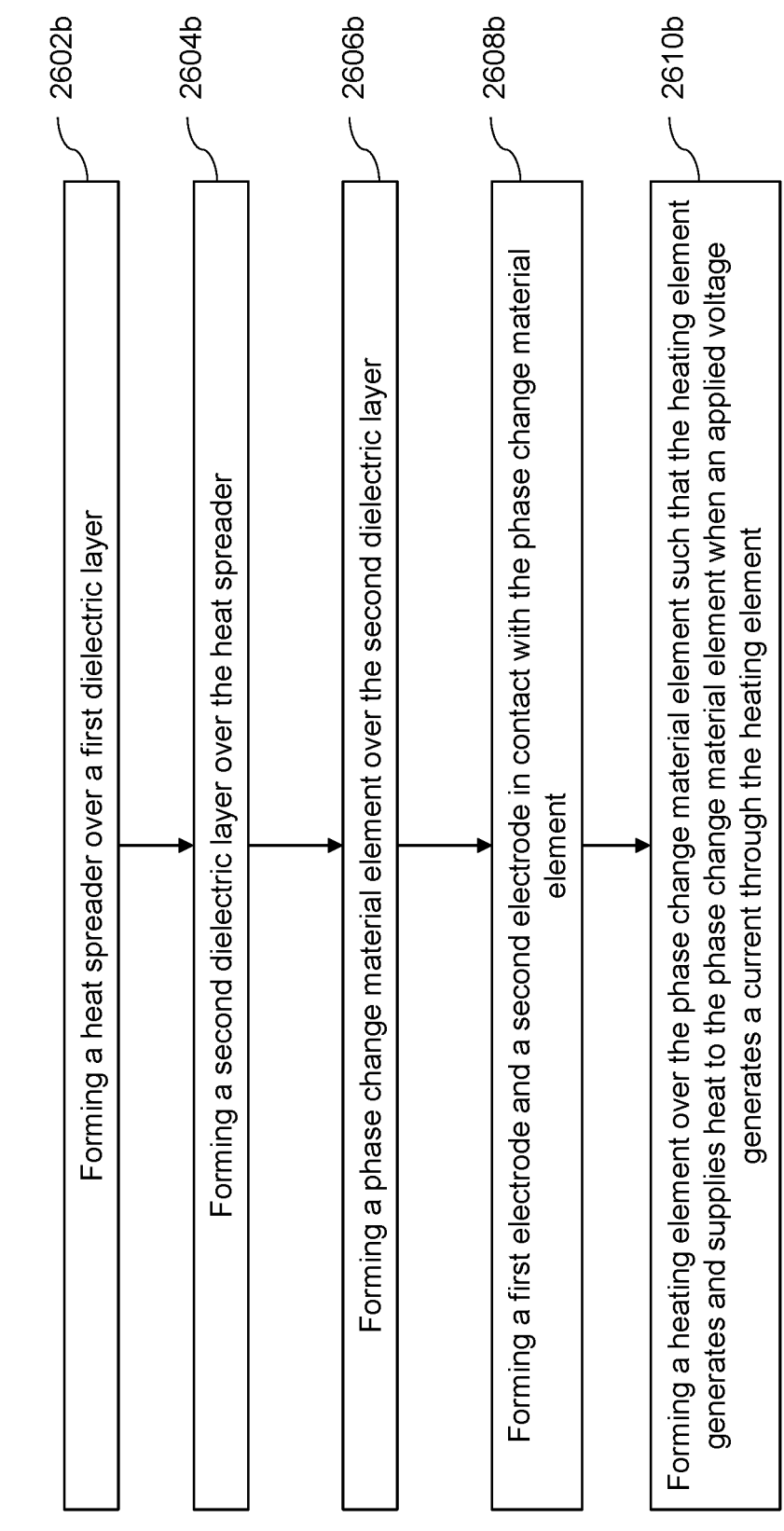

2600b

2602b — Forming a heat spreader over a first dielectric layer

2604b — Forming a second dielectric layer over the heat spreader

2606b — Forming a phase change material element over the second dielectric layer 2608b — Forming a first electrode and a second electrode in contact with the phase change material element 2610b — Forming a heating element over the phase change material element such that the heating element generates and supplies heat to the phase change material element when an applied voltage generates a current through the heating element

FIG. 26B

PHASE CHANGE MATERIAL SWITCH WITH IMPROVED THERMAL DISSIPATION AND METHODS FOR FORMING THE SAME

RELATED APPLICATIONS

This application claims priority from U.S. Provisional Application Ser. No. 63/406,758 entitled "Phase Change Material Switch with Improved Thermal Dissipation And Methods For Forming The Same," filed on Sep. 15, 2022, the entire contents of which are incorporated herein by reference for all purposes.

BACKGROUND

Phase change material (PCM) switches are used for various applications such as radio-frequency (RF) applications. Advantages of PCM switches include their immunity to interference by electromagnetic radiation, relatively fast switching times, and ability to maintain their switching state (i.e., "On" or "Off") without consuming electrical power.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 26A is a flowchart illustrating operations of an embodiment method of fabricating a PCM switch, according to various embodiments.

FIG. 26B is a flowchart illustrating operations of a further embodiment method of fabricating a PCM switch, according to various embodiments.

DETAILED DESCRIPTION

Figure 1:
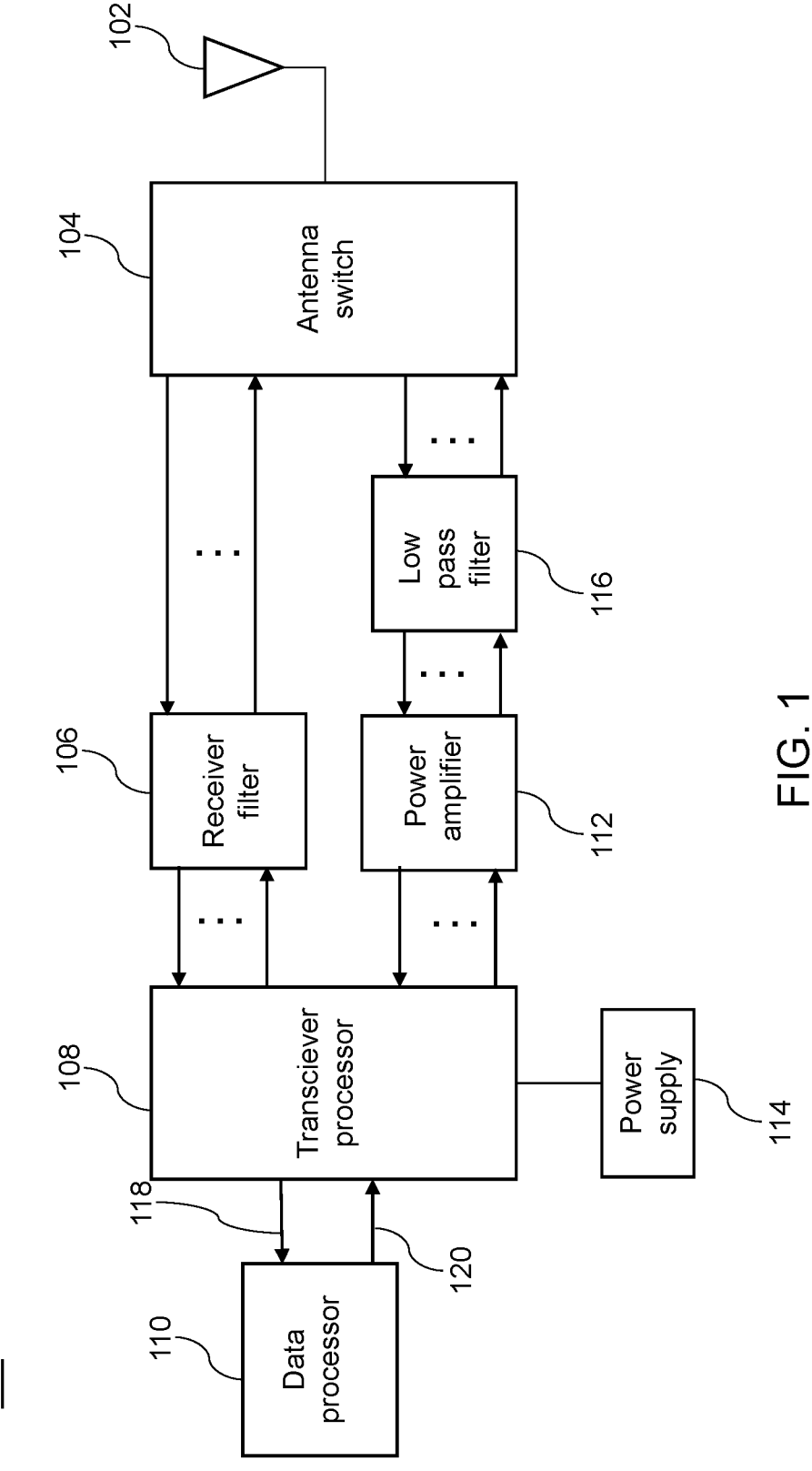
FIG. 1 is an exemplary block diagram of an RF transceiver system, according to various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element and are presumed to have the same material composition and the same thickness range unless expressly indicated otherwise.

Various embodiment structures and methods are disclosed herein that may be used to form a phase change material (PCM) switch. Various embodiment PCM switches may be used to provide a switching function for various semiconductor devices such as radio-frequency semiconductor devices, varactors (i.e., variable capacitance capacitors), inductors, or other semiconductor devices.

As used herein, a "phase change material" refers to a material having at least two distinct phases providing different resistivity. The distinct phases may include an amorphous state having relatively high resistivity and a crystalline state having relatively low resistivity (i.e., a lower resistivity than in the amorphous state). The transition between the amorphous state and the crystalline state may be induced by controlling a time-versus-temperature thermal profile within the phase change material. For example, a PCM switch may include a resistive heating element thermally coupled to the phase change material and configured to selectively heat the phase change material via the application of current pulses through the resistive heating element.

To induce a transition of the phase change material from a low-resistivity crystalline state to a high-resistivity amorphous state, the current pulse through the resistive heating element may have a relatively short pulse width with a short falling time that is configured to quickly heat the phase change material to a temperature above its melting temperature ($T_{melt}$), causing the material to transition from an ordered crystalline low-resistivity phase to a disordered amorphous high-resistivity phase. The short falling time of the pulse promotes rapid quenching and inhibits re-crystallization of the material as it cools.

To induce a transition of the phase change material from a high-resistivity amorphous state to a low-resistivity crystalline state, the current pulse through the resistive heating element may have a relatively longer pulse width with a longer pulse falling time that is configured to heat the phase change material to a temperature above its crystallization temperature ($T_{crys}$), but below its melting temperature ($T_{melt}$), over a time period sufficient to induce crystal nucleation in the material. The comparatively long falling time of the current pulse promotes crystal growth as the phase change material cools at a relatively slower rate.

A PCM switch may include a phase change material disposed within a signal transmission pathway between a pair of electrodes. The resistive heating element may extend across the phase change material in a direction transverse to the signal transmission pathway, and a layer of electrically-insulating and thermally-conductive material may be disposed between the resistive heating element and the phase change material. While the phase change material is in a low-resistivity crystalline state, the PCM switch may be in an "On" state (i.e., the switch is closed) such that signals may be transmitted across the phase change material between the pair of electrodes. However, when a portion of the phase change material along the signal transmission pathway is in a high-resistivity amorphous state, the PCM switch may be in an "Off" state (i.e., the switch is open) such that signal transmission between the pair of electrodes is blocked. The PCM switch may be switched (i.e., programmed) between the "On" state and the "Off" state by the selective application of current pulses to the resistive heating element having different pulse widths and falling times as described above. The portion of the phase change material that is switched between a low-resistivity crystalline state and a high-resistivity amorphous state may be referred to as the active region of the phase change material.

Radio-frequency switches are commonly found in, among other things, wireless communication devices. Such switches may be configured to facilitate coupling various circuits of a wireless communication device to an antenna. For example, it may be desirable to couple a first set of circuits to the antenna when receiving information through the antenna and to couple a second set of circuits to the antenna when transmitting information. As another example, it may be desirable to couple a first set of circuits to the antenna when communicating via a first communication scheme and to couple a second set of circuits to the antenna when communicating via a second communication scheme.

For a switch used in radio-frequency (RF) applications, relevant factors for evaluating switch performance may include insertion loss, isolation, and power handling. In general, low insertion loss and high isolation are desirable characteristics for RF switches. For PCM switches, insertion loss may be related to the resistivity $R_{ON}$ across the phase change material when the switch is in the "On" state, while high isolation is inversely related to the capacitance $C_{OFF}$ of the switch while in the "Off" state. A figure of merit (FOM) that may be used to characterize performance of a PCM switch may be chosen to have a value that is inversely proportional to the product $R_{ON}*C_{OFF}$. For example, one FOM that may be used to characterize switch performance may be taken to be $\sim 1/(2\pi R_{ON}*C_{OFF})$. This FOM has frequency units and may be related to a maximum frequency at which the PCM material may be switched from an "On" state to an "Off" state. In general, increasing the value the FOM may be associated with improved switch performance. Thus, switch performance may be improved by reducing the $R_{ON}$ characteristics, reducing the $C_{OFF}$ characteristics, or both, in a PCM switch. The switching time of a PCM switch may also depend on a rate at which thermal energy may be diffused away from the PCM switch.

Various disclosed embodiments include PCM switches that may provide improved thermal confinement within the phase change material layer and improved thermal diffusion. In various embodiments, a thermally-conductive dielectric capping layer (e.g., including a high-k dielectric material) located between a heater pad and the phase change material layer of the PCM switch may be laterally-confined such that opposing sides of the dielectric capping layer and opposing sides of the underlying heater pad may form continuous surfaces extending transversely to the signal transmission pathway across the phase change material between the pair of electrodes.

The heat transfer from the heater pad through the dielectric capping layer to the phase change material layer may be predominantly along a vertically upwards direction, such that heating of the phase change material layer may be nearly exclusively confined to a region of the phase change material layer located directly above the heater pad, with minimal thermal dissipation along a lateral direction. This localized heating of the phase change material may improve the efficiency of the PCM switch by enabling the use of lower bias voltages across the heater pad and may minimize the occurrence of unwanted intermediate resistivity states within the phase change material layer.

The presence of a thermal spreader structure may improve removal of thermal energy after switching events. These structural features may, in turn, improve the $R_{ON}$ characteristics of the PCM switch. Further, because the laterally-confined dielectric capping layer is laterally offset from the electrodes contacting the phase change material layer, the relatively high-k dielectric capping layer may not significantly contribute to the $C_{OFF}$ characteristics of the switch. Accordingly, a high-performance PCM switch with an increased figure of merit (FOM) may be provided.

An embodiment phase change material switch may include a phase change material element having a first electrode and a second electrode, a heating element coupled to a first side of the phase change material element, and a heat spreader formed on a second side of the phase change material element opposite to the heating element. The phase change material element may include a phase change material that switches from an electrically conducting phase to an electrically insulating phase by application of a heat pulse by the heating element. The first electrode, the second electrode, the phase change material element, and the heat spreader may be configured as an RF switch that blocks RF signals when the phase change material element is the electrically insulating phase and conducts RF signals when the when the phase change material element is in the electrically conducting phase. The heat spreader may be electrically isolated from the heating element and the phase change material element.

A further embodiment phase change material switch may include a phase change material element having a first electrode and a second electrode, a first conductor coupled the first electrode, a second conductor coupled to the second electrode, a heating element coupled to a first side of the phase change material element and configured to supply a heat pulse to the phase change material element, and a heat spreader. The phase change material element may include a phase change material that switches from an electrically conducting phase to an electrically insulating phase by application of the heat pulse by the heating element. Further, the first conductor, the second conductor, and the phase change material element, may be configured as an RF switch that blocks RF signals when the phase change material element is the electrically insulating phase and conducts RF signals when the when the phase change material element is in the electrically conducting phase.

An embodiment method of forming a switch may include forming a phase change material element; forming a heating element on a first side of the phase change material element such that the heating element generates and supplies heat to the phase change material element when an applied voltage generates a current through the heating element; forming a heat spreader on a second side of the phase change material element opposite to the heating element; forming a first electrode in contact with the phase change material element; and forming a second electrode in contact with the phase change material element. The phase change material element may include a phase change material that switches from an electrically conducting phase to an electrically insulating phase by application of a heat pulse by the heating element. Further, the first electrode, the second electrode, the heating element, and the phase change material element, may be configured as an RF switch that blocks RF signals when the phase change material element is the electrically insulating phase and conducts RF signals when the when the phase change material element is in the electrically conducting phase.

FIG. 1 is an exemplary block diagram of an RF transceiver system 100, according to various embodiments. The RF transceiver system 100 may include at least one antenna 102, an antenna switch 104, a receiver filter 106, a transceiver processor 108, a data processor 110, a power amplifier 112, a power supply 114, and a low-pass filter 116. In some embodiments, the antenna switch 104 may be used to direct a signal from the antenna 102 to the receiver filter 106 or from the low pass filter 116 output to the antenna 102. The antenna switch may have low loss (<0.1 dB) to avoid adding to system noise or attenuating the transmit signal.

In some embodiments, the receiver filter 106 may be configured to filter signals to eliminate out-of-band signals so that such out-of-band signals may not be amplified or impact the linearity of the transceiver processor 108. In some embodiments, the transceiver processor 108 may further include at least one of a low noise amplifier, an RF filter, a mixer, a demodulator, a digital-to-analog converter, an analog-to-digital converter, and a modulator. First data 118, which may be received from the receiver filter 106 may be provided to a data processor 110. Similarly, second data 120, which is to be provided to the antenna 102 for transmission by the antenna 102, may be provided from the data processor 110 to the transceiver processor 108. After being processed by the transceiver processor 108, the second data 120 may be amplified by the power amplifier 112 and may be filtered by the low pass filter 116 before being provided to the antenna switch 104. In turn, the antenna switch 104 may provide the second data 120, received from the low pass filter 116, to the antenna 102 for transmission. In the illustrated embodiment RF transceiver system 100, the antenna switch 104 may share one antenna 102 in transmission and reception and may be configured and controlled to switch the signal path. In some embodiments, the antenna switch 104 may be configured to exhibit low loss and low power consumption.

Figures 2A, 2B:
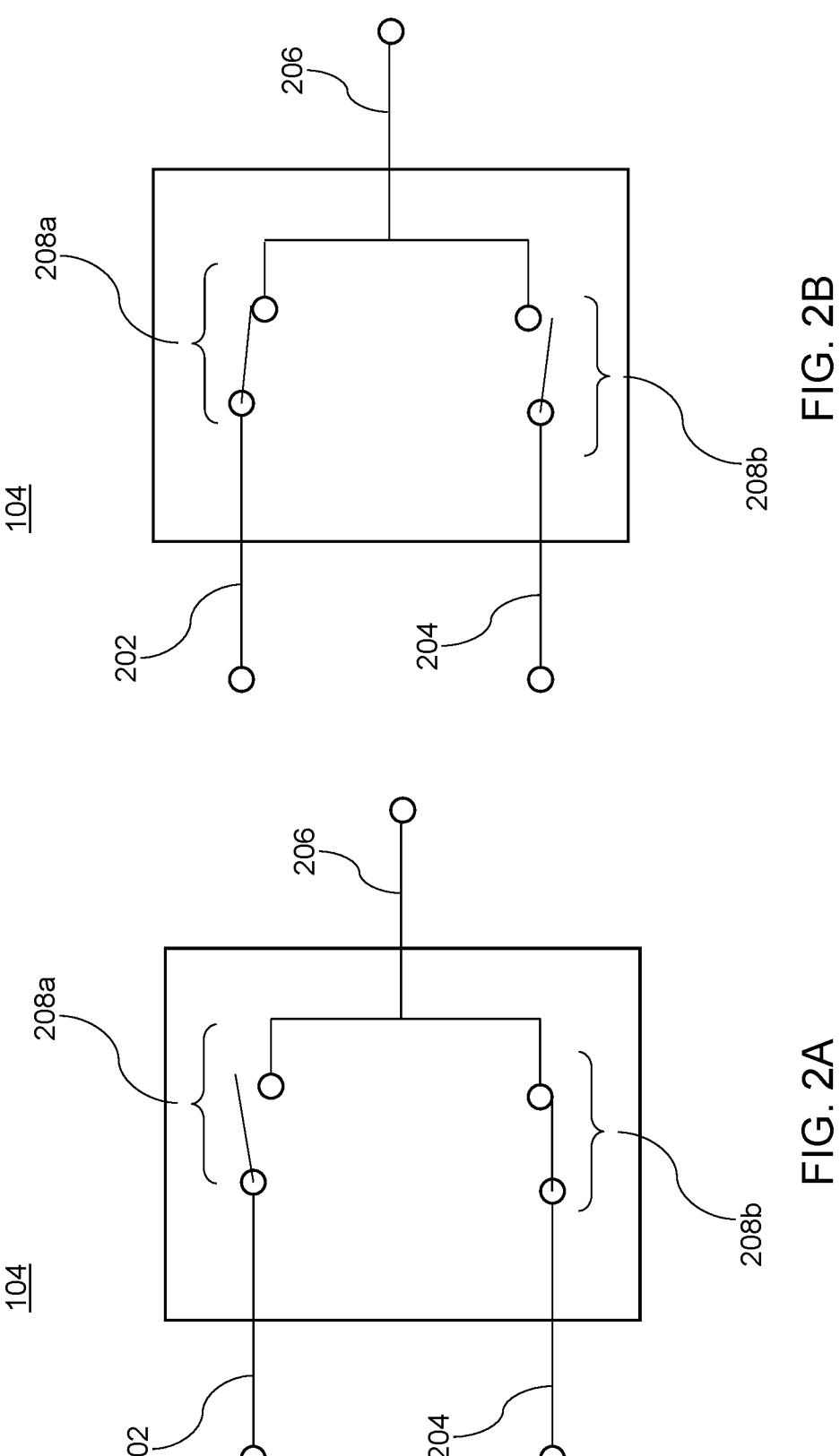
FIG. 2A is a schematic illustration of an antenna switch in a first configuration, according to various embodiments.
FIG. 2B is a schematic illustration of the antenna switch in a second configuration, according to various embodiments.

FIG. 2A is a schematic illustration of the antenna switch 104 in a first configuration, and FIG. 2B is a schematic illustration of the antenna switch 104 in a second configuration. The antenna switch 104 may include a receive node 202, a transmit node 204, and an antenna node 206. The antenna switch 104 may include a first RF switch 208a and a second RF switch 208b. As shown in FIG. 2A, in a first configuration, the first RF switch 208a may be open and the second RF switch 208b may be closed. As such, the antenna node 206 may be electrically connected to the transmit node 204. Alternatively, as shown in FIG. 2B, the first RF switch 208a may be closed and the second RF switch 208b may be open. As such, the antenna node 206 may be electrically connected to the receive node 202.

FIGS. 2A and 2B, suggest that the antenna switch 104 may be implemented using two RF switches (208a, 208b). Such RF switches (208a, 208b) may each be implemented using one or more transistors, resistors, inductors, capacitors, diodes, etc. For example, the antenna switch 104 may include various other circuit components such as a voltage controller. In various embodiments, various circuit components may include switching elements including one or more suitable electronic switches, such as insulated gate bipolar transistors (IGBTs), bipolar junction transistors (BJTs), field-effect transistors (FETs), metal-oxide semiconductor field-effect transistors (MOSFETs), gate turnoff thyristors (GTOs), integrated gate-commutated thyristors (IGCTs), bidirectional triode thyristors (TRIACs), etc. Various other embodiments may be implemented using high-performance PCM switch elements, as described in greater detail below.

Figure 3A:
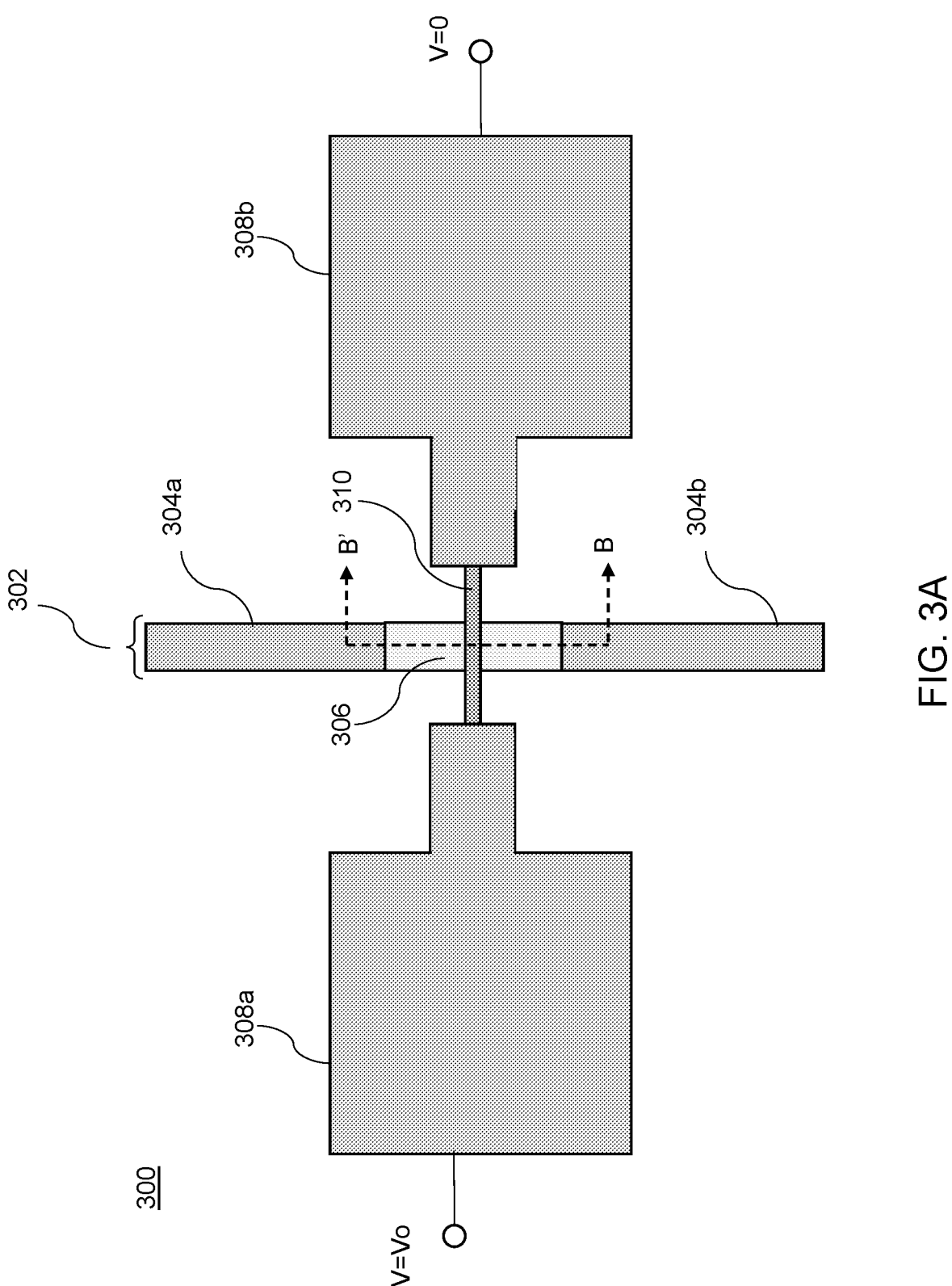
FIG. 3A is a top view of a PCM switch, according to various embodiments.
Figure 3B:
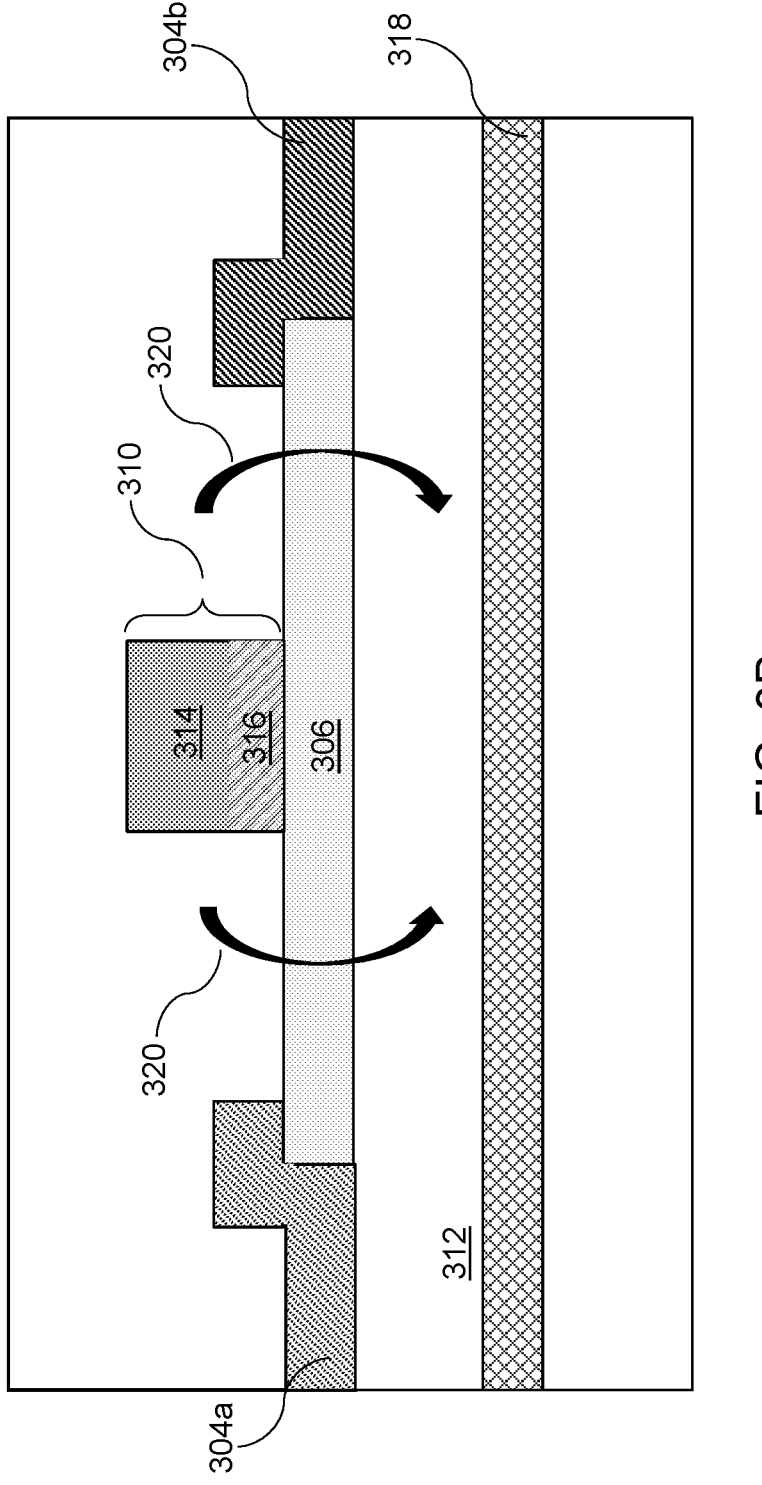
FIG. 3B is a vertical cross-sectional view of a portion of the PCM switch of FIG. 3A, according to various embodiments.

FIG. 3A is a top view of a first PCM switch 300, and FIG. 3B is a vertical cross-sectional view of a portion of the first PCM 300 switch of FIG. 3A, according to various embodiments. The vertical cross-sectional plane that defines the view of FIG. 3B is indicated by the cross-section B-B' in FIG. 3A. The first PCM switch 300 may include an RF signal line 302 having a first RF conductor 304a and a second RF conductor 304b. The first PCM switch 300 may further include a PCM element 306 that may be in contact with the first RF conductor 304a and the second RF conductor 304b. As described above, the PCM element 306 may be in a conducting state or in an insulating state. In instances in which the PCM element 306 is in a conducting state, the PCM switch is closed (i.e., the switch is in an "On" state) and RF signals may propagate along the RF signal line 302 from the first RF conductor 304a to the second RF conductor 304b or from the second RF conductor 304b to the first RF conductor 304a. In instances in which the PCM element 306 is in an insulating state, the first PCM switch 300 is open (i.e., the switch is in an "Off") state and propagation of RF signals along the RF signal line 302 is prevented.

The first PCM switch 300 may further include a first heater pad 308a and a second heater pad 308b. The first heater pad 308a and the second heater pad 308b may each be electrically connected to a heating element 310. The first heater pad 308a, the second heater pad 308b, and the heating element 310 may each be formed of a conducting material. In some embodiments, each of the first heater pad 308a, the second heater pad 308b, and the heating element 310, may be formed of the same conducting material. Alternatively, two or more different electrically conducting materials may be used for the first heater pad 308a, the second heater pad 308b, and the heating element 310.

Application of voltage difference between the first heater pad 308a (e.g., held at V=Vo) and the second heater pad 308b (e.g., held at V=0) may generate an electrical current that may flow from the first heater pad 308a, through the heating element 310, and to the second heater pad 308b, or from the second heater pad 308b, through the heating element 310, and to the first heater pad 308a, depending on the sign of the applied voltage Vo. The resistance of a given electrical circuit element (e.g., each of the first heater pad 308a, the second heater pad 308b, and the heating element 310) is proportional to a length along the direction of current flow and inversely proportional to a cross-sectional area perpendicular to current flow. As such, the first heater pad 308a and the second heater pad 308b may be configured to have a considerably larger width that that of the heating element 310. Therefore, for a given applied voltage difference, the current density will be considerably larger in the heating element 310 relative to that in either of the first heater pad 308a and the second heater pad 308b. As such, heat generated due to Ohmic loss will be produced at a greater rate (i.e., have a greater value of $I^2R$ power) in the heating element 310 in comparison with heat generated in the first heater pad 308a and the second heater pad 308b. As such, heat may be preferentially generated by the heating element 310 and may be delivered to the PCM element 306.

As shown in FIG. 3B, the PCM switch 300 may include a PCM element 306 electrically connected to the first RF conductor 304a and to the second RF conductor 304b. Each of the first RF conductor 304a, the second RF conductor 304b, and the PCM element 306 may be formed over a first switch dielectric material layer 312. As described in greater detail below, the heating element 310 may be formed above the PCM element 306 such as to be in contact with a portion of the PCM element 306. In this example embodiment, the heating element 310 may include a conductive heater pad 314 and a capping layer 316. Further, the capping layer 316 may be an electrically insulating material while being a heat conductor.

As shown in FIG. 3B, the first PCM switch 300 may further include a heat spreader 318 formed below the PCM element 306 on an opposite side of the PCM element 306 from the heating element 310. The heat spreader 318 may be formed of a material having a high thermal conductivity. For example, the heat spreader 318 may have a planar slab geometry and may be a metal or a compound semiconductor (e.g., SiC) having a high thermal conductivity (e.g., >100 W/mK). The heat spreader 318 may be configured to remove heat from the PCM element 306 during a cool-down phase after a switching event (e.g., switching from insulating to conducting or from conducting to insulating).

As shown, the heat spreader 318 may be configured to cause heat to flow preferentially from the heating element 310, through the PCM element 306, and toward the heat spreader 318, as indicated by the arrows 320 shown in FIG. 3B. Thus, the heating element 310 is coupled to a first side (e.g., the top side) of the phase change material element 306 and the heat spreader 318 is formed on a second side (e.g., the bottom side) of the phase change material element 306 opposite to the heating element 310. In contrast, however, if the heat spreader 318 and the heating element were to be formed on the same side of the phase change material element 306 (e.g., in the top of FIG. 3B) in other embodiments, the resulting structure may exhibit a disadvantage in that heat may be drawn away from the heating element 310 and the phase change heating element 306 (e.g., upward in FIG. 3B) leading to an inefficiency of heating the phase change material element 306. The embodiment of FIG. 3B may therefore provide an advantage over such alternative embodiments in that the phase change material element 306 may be directly quenched (i.e., heat removed) after a switching event leading to a faster switching time and more efficient heating of the phase change material element 306 (relative to embodiments in which the heat spreader 318 may be placed on the same side as the heating element 310).

Figure 4A:
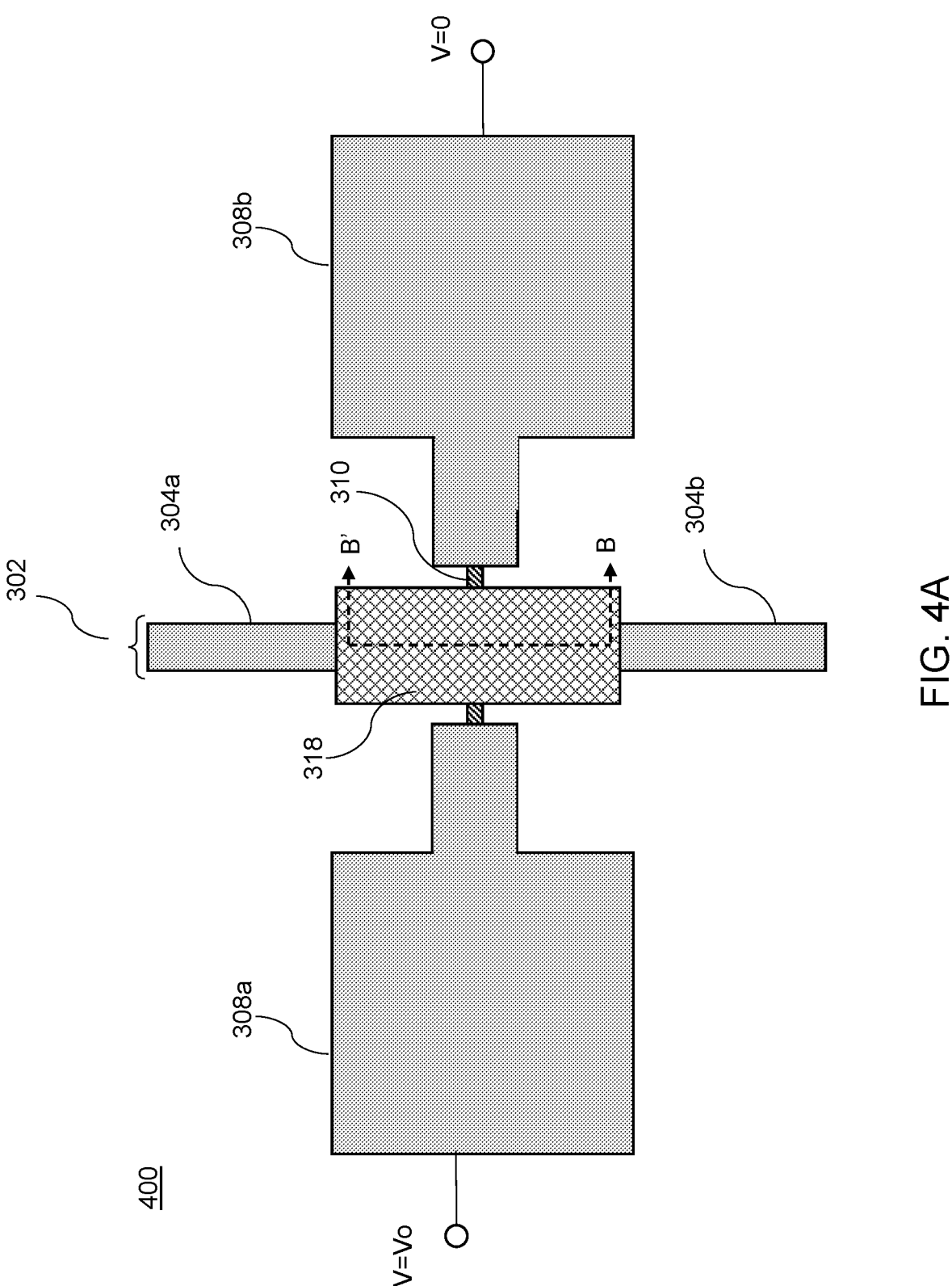
FIG. 4A is a top view of a further PCM switch, according to various embodiments.
Figure 4B:
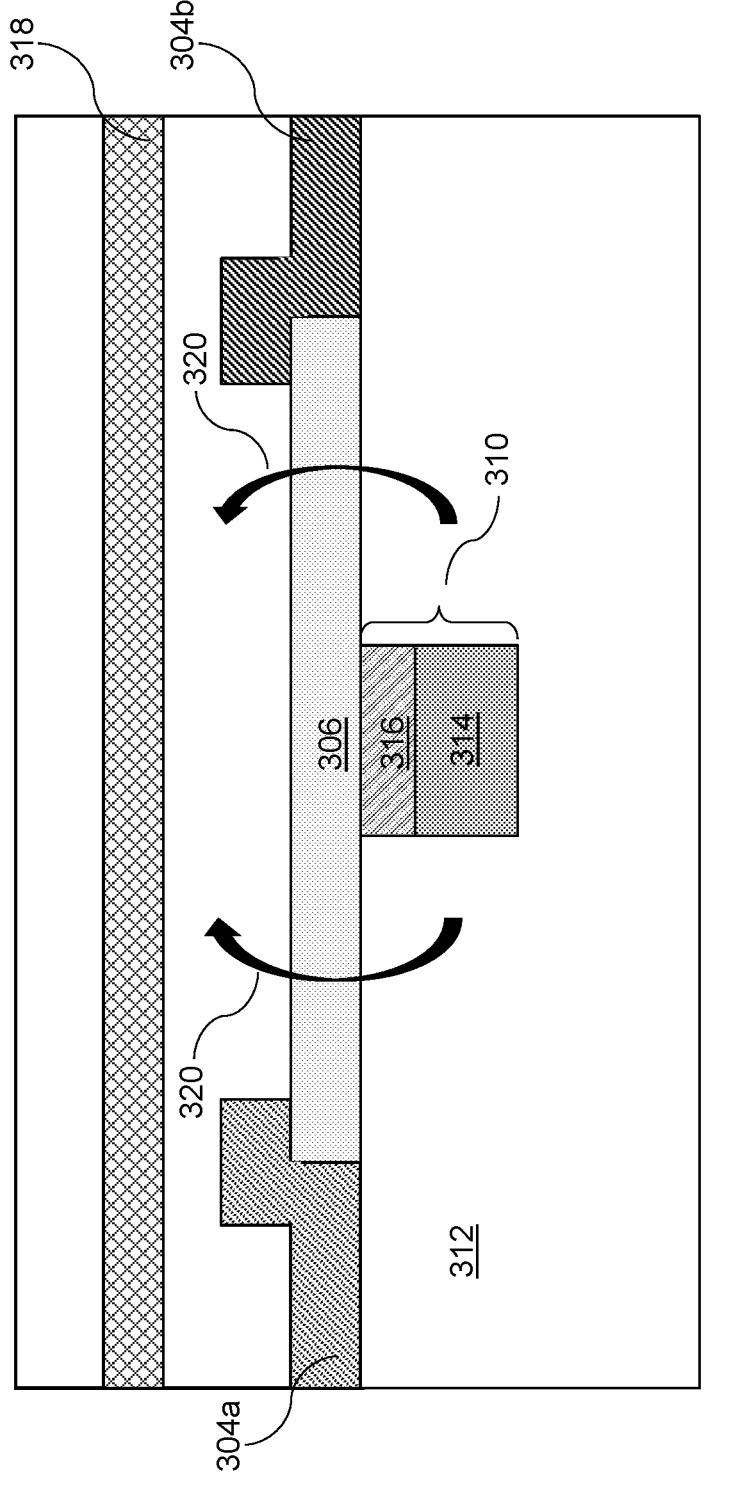
FIG. 4B is a vertical cross-sectional view of the PCM switch of FIG. 4A, according to various embodiments.

FIG. 4A is a top view of a second PCM switch 400, and FIG. 4B is a vertical cross-sectional view of a portion of the second PCM switch 400 of FIG. 4A, according to various embodiments. The vertical cross-sectional plane that defines the view of FIG. 4B is indicated by the cross-section B-B' in FIG. 4A. The second PCM switch 400 may have many of the same components as that of the first PCM switch 300. In contrast to the embodiment first PCM switch 300 of FIG. 3, however, the second PCM switch 400 of FIG. 4 may include a configuration in which the position of the heating element 310 and the heat spreader 318 are swapped (e.g., heat spreader 318 above and heating element 310 below the PCM element 306). As such, heat may preferentially flow from the heating element 310, through the PCM element 306, and toward the heat spreader 318 in the opposite direction (e.g., up) from that of the embodiment of FIG. 3B, as shown by the arrows 320 in FIG. 3B. Thus, the heating element 310 is coupled to a first side (e.g., the bottom side) of the phase change material element 306 and the heat spreader 318 is formed on a second side (e.g., the top side) of the phase change material element 306 opposite to the heating element 310.

As shown in FIGS. 3B and 4B, the heating element 310 may have a localized spatial extent relative to the phase change material element 306. As such, heat may be applied to the phase change material element 306 in a localized distribution. The localized spatial distribution of heat provided to the phase change material element 306 may reduce a power required to switch the phase change material. Further, the presence of the heat spreader 318 may provide more efficient removal of heat following switching events, which may increase a switching speed of the PCM switch.

In some embodiments, the heat spreader 318 may include a metal or a compound semiconductor having a thermal conductivity greater than 100 W/mK. The heat spreader 318 may also include Cu or SiC. The heat spreader 318 may further be electrically isolated from the heating element 310 and the phase change material element 306 (e.g., see FIG. 4B). The heat spreader 318 may further be separated from the phase change material element 306 by an electrically insulating material (1902, 1904) having a thermal conductivity in a range from approximately 0.1 W/mK to approximately 50 W/mK.

Further, the phase change material element 306 may include a material having a thermal conductivity in a range from approximately 2.5 W/mK to approximately 10 W/mK. The phase change material element 306 may include at least one of a germanium telluride compound, an antimony telluride compound, a germanium antimony telluride compound, a germanium antimony compound, an indium germanium telluride compound, an aluminum selenium telluride compound, an indium selenium telluride compound, and an aluminum indium selenium telluride compound.

The heating element 310 may include a heater pad 314 that generates heat when an applied voltage generates a current through the heater pad 314. The heater pad 314 may further include a material that is at least one of tungsten, tungsten nitride, titanium nitride, and a nickel silicide. Other suitable materials are within the contemplated scope of disclosure. Further, the heater pad 314 may include a material having a thermal conductivity greater than 175 W/mK.

The PCM switch (300, 400) may further include a dielectric capping layer 316 that is in contact with the phase change material element 306 and that separates the heater pad 314 from the phase change material element 306. The dielectric capping layer 316 may include an electrical insulator having a thermal conductivity greater than 100 W/mK. The dielectric capping layer 316 may include at least one of silicon nitride, silicon carbide, silicon carbide nitride, and aluminum nitride. In some embodiments, the phase change material element 306 may be configured to switch from the conducting phase to the insulating phase within a time that is approximately $5.0 \times 10^{-7}$ sec or less.

The first conductor 304a, the second conductor 304b, and the phase change material element 306 may be configured to form an RF PCM switch (300, 400) that block RF signals when the phase change material element 306 is the electrically insulating phase and conducts RF signals when the when the phase change material element 306 is in the electrically conducting phase. The heat spreader 318 may be formed on a second side of the phase change material element 306 opposite to the heating element 310 (e.g., see FIG. 4B). In certain embodiments, the heat spreader 318 may include a metal or a compound semiconductor having a thermal conductivity greater than 100 W/mK. Further, heat spreader 318 may be electrically isolated from the heating element 310 and the phase change material element 306. Various methods for fabricating PCM switches (300, 400, 2000, 2500) are described with reference to FIGS. 5 to 25, below.

Figure 5:
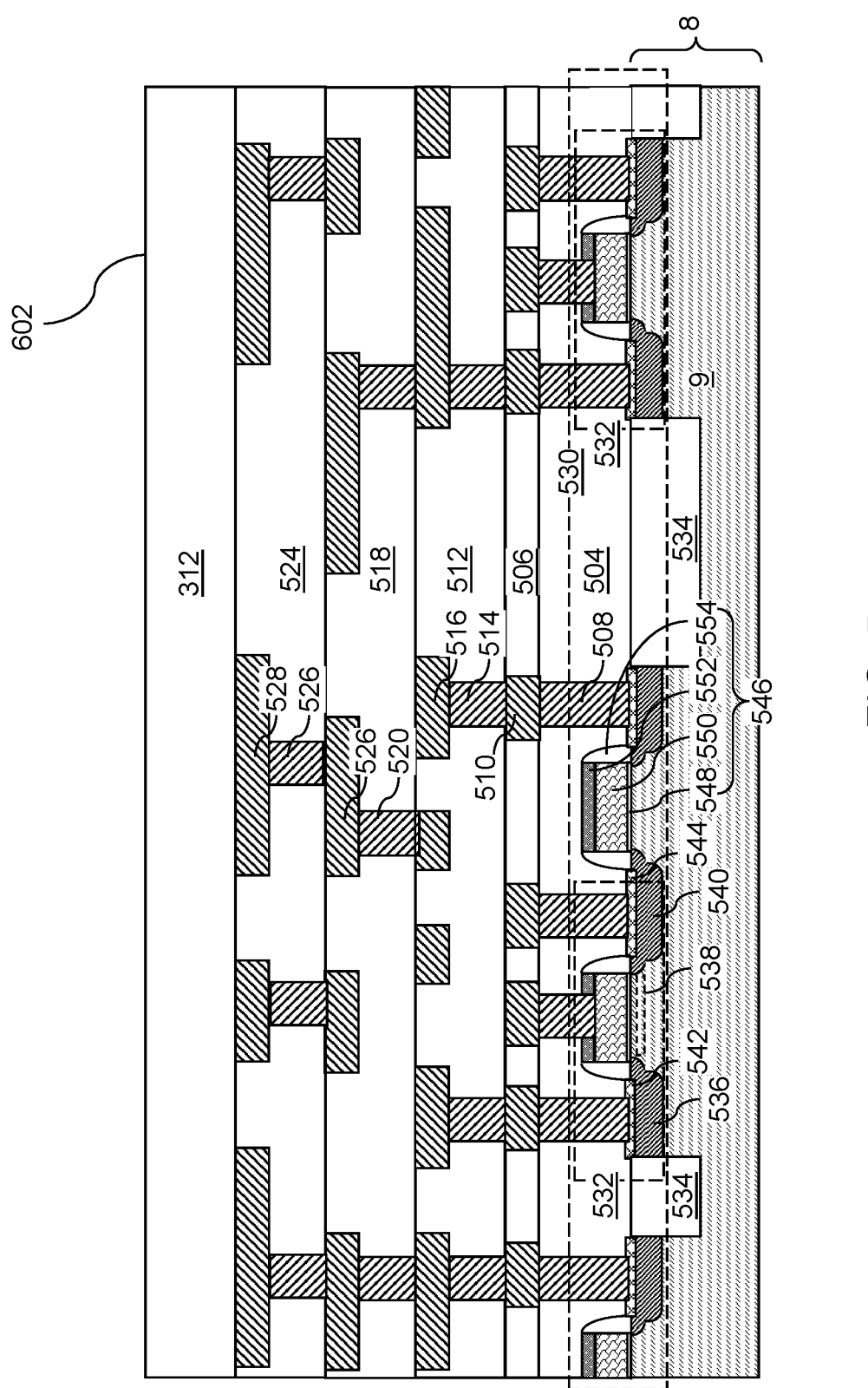
FIG. 5 is a vertical cross-sectional view of a first exemplary structure after formation of complementary metal-oxide-semiconductor (CMOS) transistors, metal interconnect structures, and dielectric material layers, according to various embodiments.

FIG. 5 is a vertical cross-sectional view of a first exemplary structure prior to formation of a PCM switch according to various embodiments. The first exemplary structure may include a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate or may be a top semiconductor layer of a semiconductor-on-insulator (SOI) substrate. In one embodiment, the semiconductor material layer 9 may include a single crystalline semiconductor material such as single crystalline silicon. In one embodiment, the substrate 8 may include a single crystalline silicon substrate including a single crystalline silicon material.

Shallow trench isolation structures 534 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 534. Field effect transistors 532 may be formed over the top surface of the semiconductor material layer 9. For example, each field effect transistor 532 may include a source electrode 536, a drain electrode 540, a semiconductor channel 538 that may include a surface portion of the substrate 8 extending between the source electrode 536 and the drain electrode 540, and a gate structure 546. The semiconductor channel 538 may include a single crystalline semiconductor material. Each gate structure 546 may include a gate dielectric layer 548, a gate electrode 550, a gate cap dielectric 552, and a dielectric gate spacer 554. A source-side metal-semiconductor alloy region 542 may be formed on each source electrode 536, and a drain-side metal-semiconductor alloy region 544 may be formed on each drain electrode 540. The devices formed on the top surface of the semiconductor material layer 9 may include complementary metal-oxide-semiconductor (CMOS) transistors and optionally additional semiconductor devices (such as resistors, diodes, capacitor structures, etc.), and are collectively referred to as CMOS circuitry 530.

One or more of the field effect transistors 532 in the CMOS circuitry 530 may include a semiconductor channel 538 that contains a portion of the semiconductor material layer 9 in the substrate 8. If the semiconductor material layer 9 may include a single crystalline semiconductor material such as single crystalline silicon, the semiconductor channel 538 of each field effect transistor 532 in the CMOS circuitry 530 may include a single crystalline semiconductor channel such as a single crystalline silicon channel. In one embodiment, a subset of the field effect transistors 532 in the CMOS circuitry 530 may include a respective node that is subsequently electrically connected to a node of a PCM switch to be subsequently formed.

In one embodiment, the substrate 8 may include a single crystalline silicon substrate, and the field effect transistors 532 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein and is capable of producing a doped material having electrical conductivity in a range from 1.0 S/cm to $1.0 \times 10^5$ S/cm upon suitable doping with an electrical dopant.

Various metal interconnect structures formed within dielectric material layers may be subsequently formed over the substrate 8 and the semiconductor devices 532 thereupon (such as field effect transistors). In an illustrative example, the dielectric material layers may include, for example, a first dielectric material layer 504 that may be a layer that surrounds the contact structure connected to the source and drains (sometimes referred to as a contact-level dielectric material layer 504), a first interconnect-level dielectric material layer 506, a second interconnect-level dielectric material layer 512, a third interconnect-level dielectric material layer 518, and a fourth interconnect-level dielectric material layer 524. The metal interconnect structures may include device contact via structures 508 formed in the first dielectric material layer 504 and contact a respective component of the CMOS circuitry 530, first metal line structures 510 formed in the first interconnect-level dielectric material layer 506, first metal via structures 514 formed in a lower portion of the second interconnect-level dielectric material layer 512, second metal line structures 516 formed in an upper portion of the second interconnect-level dielectric material layer 512, second metal via structures 520 formed in a lower portion of the third interconnect-level dielectric material layer 518, third metal line structures 522 formed in an upper portion of the third interconnect-level dielectric material layer 518, third metal via structures 526 formed in a lower portion of the fourth interconnect-level dielectric material layer 524, and fourth metal line structures 528 formed in an upper portion of the fourth interconnect-level dielectric material layer 524. While the present disclosure is described using an embodiment in which four levels metal line structures are formed in dielectric material layers, embodiments are expressly contemplated herein in which a lesser or greater number of levels of metal line structures are formed in dielectric material layers.

Each of the dielectric material layers (504, 506, 512, 518, 524) may include a dielectric material such as undoped silicate glass, a doped silicate glass, organosilicate glass, amorphous fluorinated carbon, porous variants thereof, or combinations thereof. Each of the metal interconnect structures (508, 510, 514, 516, 520, 522, 526, 528) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 514 and the second metal line structures 516 may be formed as integrated line and via structures by a dual damascene process. Generally, any contiguous set of a metal line structure (516, 522, 528) and at least one underlying metal via structure (514, 520, 526) may be formed as an integrated line and via structure.

Generally, semiconductor devices 532 may be formed on a substrate 8, and metal interconnect structures (508, 510, 514, 516, 520, 522, 526, 528) and dielectric material layers (504, 506, 512, 518, 524) over the semiconductor devices 532. The metal interconnect structures (508, 510, 514, 516, 520, 522, 526, 528) may be formed in the dielectric material layers (504, 506, 512, 518, 524), and may be electrically connected to the semiconductor devices.

Referring again to FIG. 5, a first switch dielectric material layer 312 may be formed over the metal interconnect structures (508, 510, 514, 516, 520, 522, 526, 528) and dielectric material layers (504, 506, 512, 518, 524). The first switch dielectric material layer 312 may include a suitable dielectric material, such as silicon oxide, undoped silicate glass, a doped silicate glass, organosilicate glass, amorphous fluorinated carbon, porous variants thereof, or combinations thereof. Other suitable dielectric materials are within the contemplated scope of disclosure. The first switch dielectric material layer 312 may be deposited using any suitable deposition process, such a chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like. The first switch dielectric material layer 312 may include a planar upper surface 602.

Figures 6A, 6B:
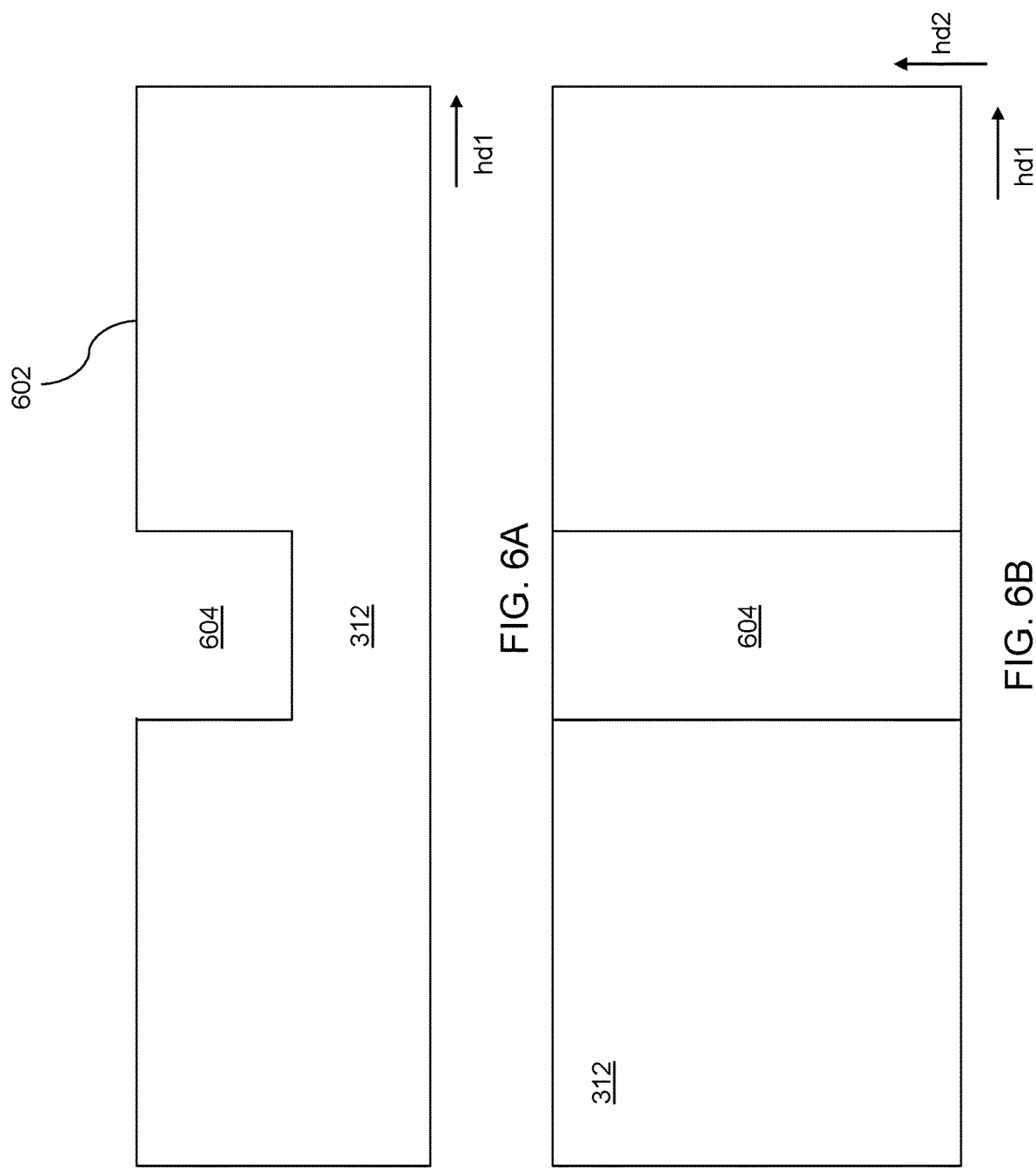
FIG. 6A is a vertical cross-section view of an exemplary intermediate structure during a process of forming a PCM switch illustrating a trench formed in a first switch dielectric material layer, according to various embodiments.
FIG. 6B is a top view of the exemplary intermediate structure of FIG. 6A.

FIG. 6A is a vertical cross-section view of an exemplary intermediate structure during a process of forming a PCM switch illustrating a trench 604 formed in the first switch dielectric material layer 312, according to various embodiments. FIG. 6B is a top view of the exemplary intermediate structure of FIG. 6A. A patterned photoresist or hard mask (not shown) may be formed over a top surface of the first switch dielectric material layer 312. An anisotropic etch process, such as a reactive ion etch process, may then be performed to etch a portion of the dielectric material layer 312 exposed through an opening in the patterned photoresist or hard mask. As shown in FIG. 6, the trench 604 may have a rectangular cross-sectional shape in a plane extending along second horizontal direction hd2, including a horizontal bottom surface and vertically-extending sidewalls. However, it will be understood that the trench 604 may have a different cross-sectional shape, such as a trapezoidal cross-section shape, and the sidewalls of the trench may include angled or curved surfaces. Following the etching process, the patterned photoresist or hard mask may be removed using a suitable process, such as via ashing or dissolution using a solvent.

Figures 7A, 7B:
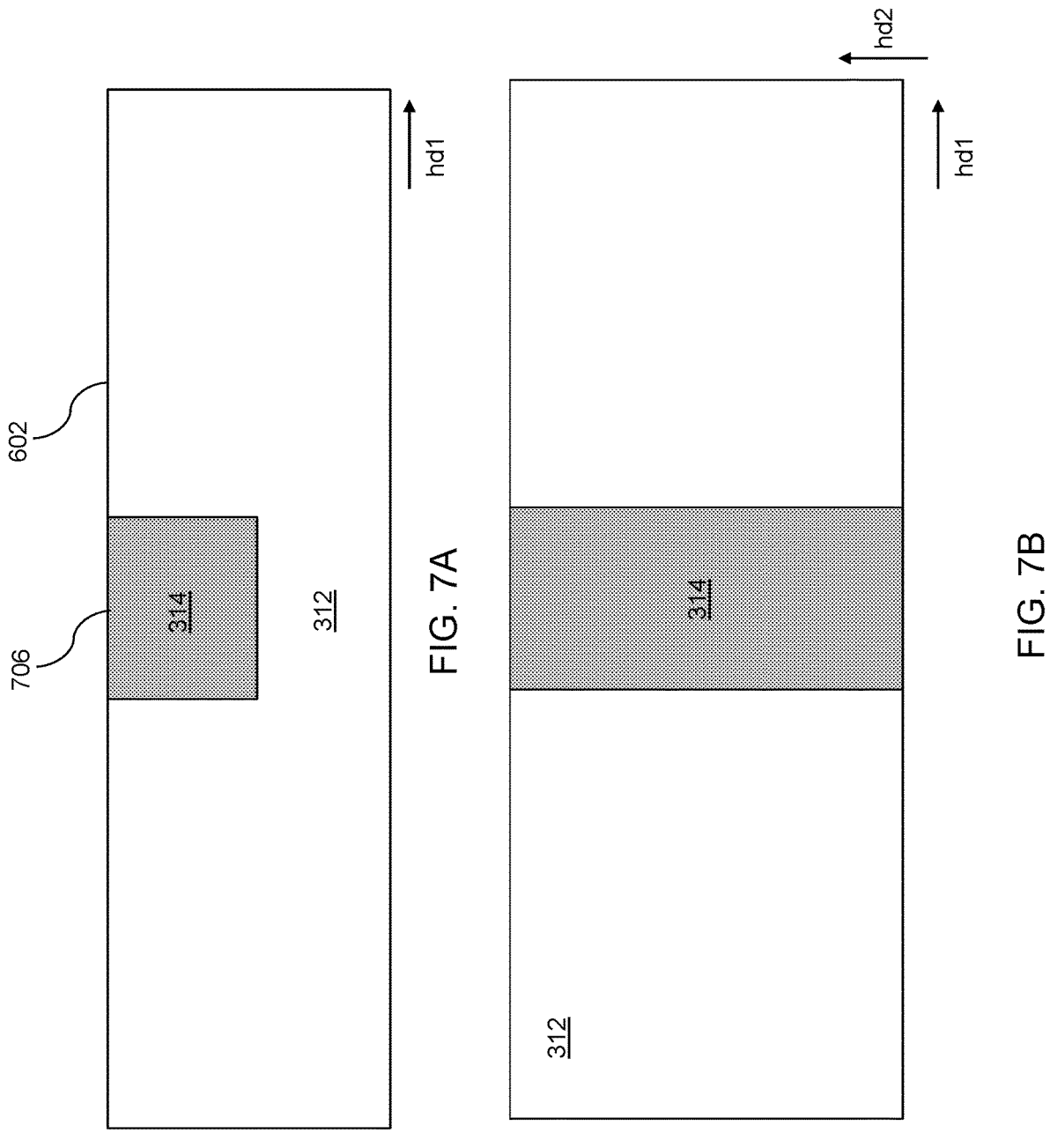
FIG. 7A is a vertical cross-section view of a further exemplary intermediate structure during a process of forming a PCM switch illustrating a heater pad embedded within the first switch dielectric material layer, according to various embodiments.
FIG. 7B is a top view of the exemplary intermediate structure of FIG. 7A.

FIG. 7A is a vertical cross-section view of an exemplary intermediate structure during a process of forming a PCM switch illustrating a heater pad 314 embedded within the first switch dielectric material layer 312, according to various embodiments. FIG. 7B is a top view of the exemplary intermediate structure of FIG. 7A. The exemplary intermediate structure of FIGS. 7A and 7B may be formed from the exemplary intermediate structure of FIGS. 6A and 6B by forming the heater pad 314 that may fill the trench 604 in the first switch dielectric material layer 312. In this regard, a continuous heater material layer (not shown) may be formed over the upper surface 602 of the first switch dielectric material layer 312 and within the trench 604 of FIGS. 6A and 6B, according to various embodiments. The continuous heater material layer may include a refractory metal, such as tungsten, a conductive metallic nitride material, such as tungsten nitride or titanium nitride, and/or a nickel silicide. Other suitable materials for the continuous heater material layer are within the contemplated scope of disclosure. The continuous heater material layer may be deposited using a suitable deposition process, such as physical vapor deposition (PVD), sputtering, chemical vapor deposition (CVD), atomic layer deposition (ALD), plasma-enhanced chemical vapor deposition (PECVD), electrochemical deposition, or combinations thereof.

A planarization process, such as a chemical mechanical planarization (CMP) process may then be performed to remove the continuous heater material layer from over the upper surface 602 of the first switch dielectric material layer 312 so that the upper surface 706 of the heater pad 314 and the upper surface 602 of the first switch dielectric material layer 312 are substantially co-planar. The first switch dielectric material layer 312 may surround the heater pad 314 over the bottom surface and lateral side surfaces of the heater pad 314, as shown in FIG. 7A.

Figure 8:
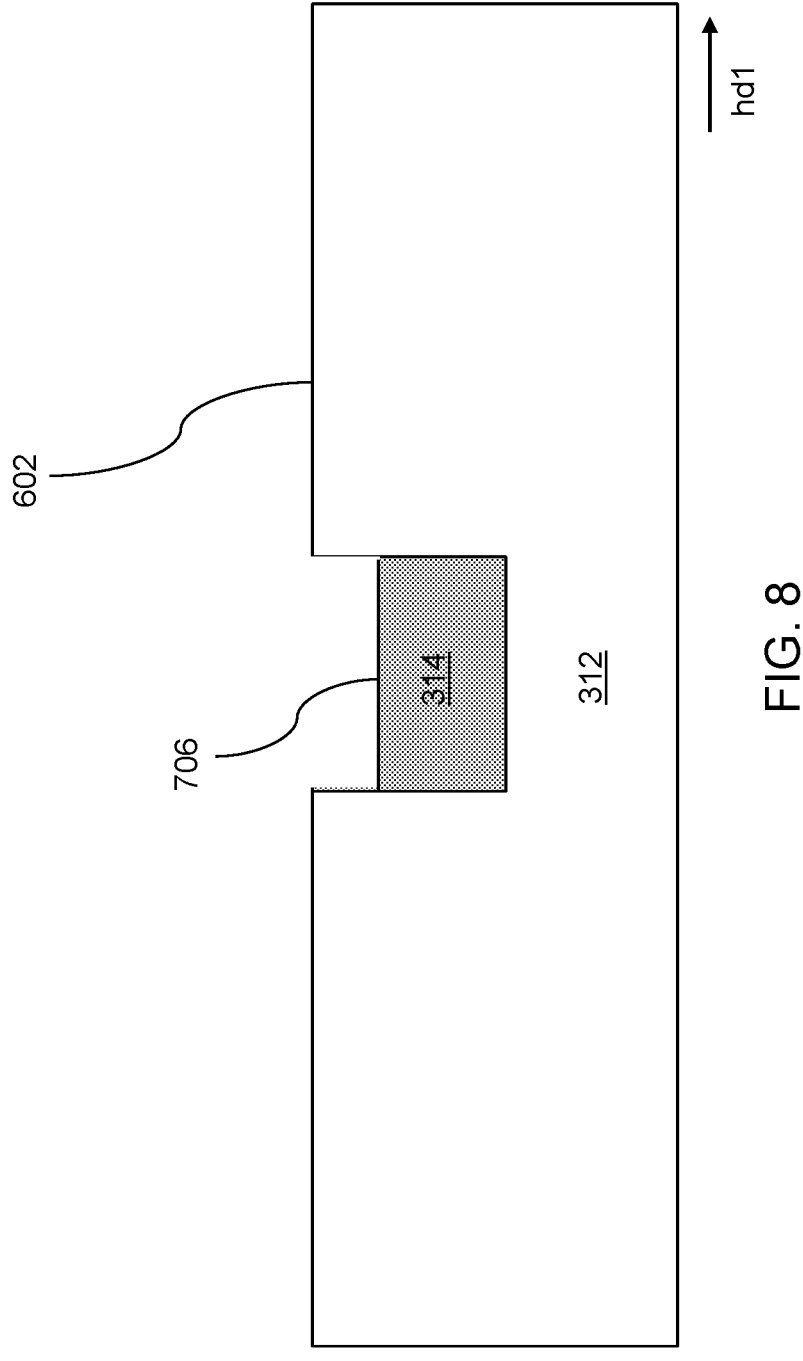
FIG. 8 is a vertical cross-section view of a further exemplary intermediate structure during a process of forming a PCM switch illustrating the upper surface of the heater pad vertically recessed with respect to the upper surface of the first switch dielectric material layer, according to various embodiments.

FIG. 8 is a vertical cross-section view of an exemplary intermediate structure during a process of forming a PCM switch illustrating the upper surface 706 of the heater pad 314 vertically recessed with respect to the upper surface 602 of the first switch dielectric material layer 312, according to various embodiments. Referring to FIG. 8, an etching process may be performed that may selectively etch the material of the heater pad 314 relative to the material of the first switch dielectric material layer 312. For example, a masking material (not shown) may be deposited over the first switch dielectric material layer 312 such that the heater pad 314 may be etched without etching the first switch dielectric material layer 312. Following the etching process, the upper surface 706 of the heater pad 314 may be vertically recessed with respect to the upper surface 602 of the first switch dielectric material layer 312. In various embodiments, the upper surface 706 of the heater pad 314 may be vertically recessed with respect to the upper surface 602 of the first switch dielectric material layer 312 by at least about 20 nm, such as 20 nm to 100 nm, including from 30 nm to 60 nm, although lesser and greater recess distances may also be used.

Figures 9A, 9B:
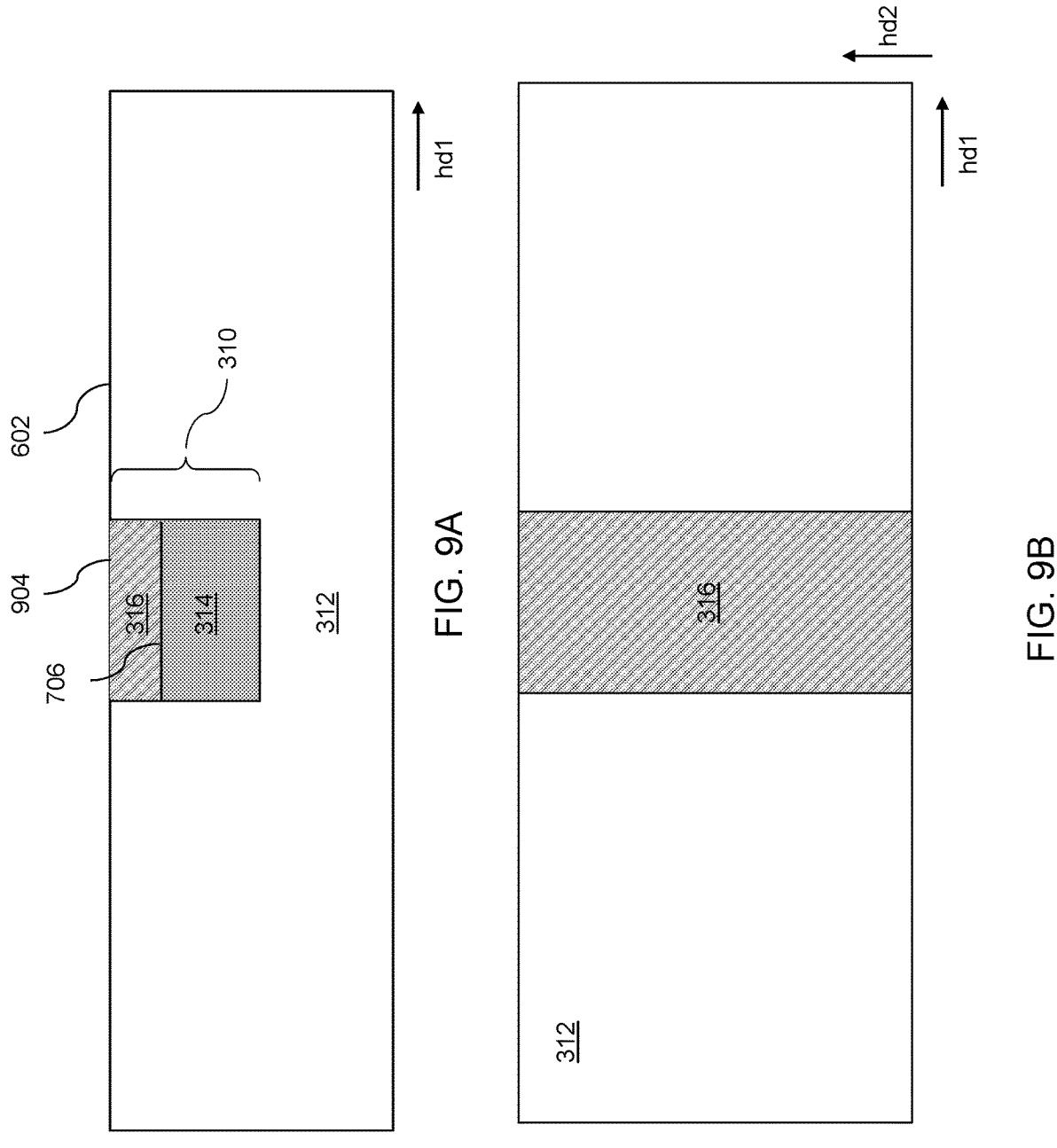
FIG. 9A is a vertical cross-section view of a further exemplary intermediate structure during a process of forming a PCM switch illustrating a dielectric capping layer over the heater pad, according to various embodiments.
FIG. 9B is a top view of the exemplary intermediate structure of FIG. 9A.

FIG. 9A is a vertical cross-section view of an exemplary intermediate structure during a process of forming a PCM switch illustrating a dielectric capping layer 316 over the heater pad 314, according to various embodiments. FIG. 9B is a top view of the exemplary intermediate structure of FIG. 9A. In this regard, a continuous dielectric capping layer (not shown) may be deposited over the upper surface 602 of the first switch dielectric material layer 312 and over the vertically-recessed upper surface 706 of the heater pad 314. A planarization process, such as a chemical mechanical planarization (CMP) process may be used to remove portions of the continuous dielectric capping layer from over the upper surface 602 of the first switch dielectric material layer 312 to generate the discrete dielectric capping layer 316.

The dielectric capping layer 316 may include a material having relatively high thermal conductivity and good electrical isolation characteristics, such as silicon nitride, silicon carbide, silicon carbide nitride, aluminum nitride, etc. Other suitable materials for the continuous dielectric material layer are within the contemplated scope of disclosure. The continuous dielectric capping layer may be deposited using a suitable deposition process as described above.

As shown in FIGS. 9A and 9B, for example, the dielectric capping layer 316 may have a strip-shape and may extend in a second horizontal direction hd2 over the upper surface 706 of the heater pad 314. The first switch dielectric material layer 312 may surround the dielectric capping layer 316 along lateral side surfaces 908a, of the first switch dielectric material layer 312. The upper surface 107 of the dielectric capping layer 316 may be coplanar with the upper surface 602 of the first switch dielectric material layer 312.

Further, as shown in FIGS. 9A and 9B, the dielectric capping layer 316 may be laterally confined along a first horizontal direction hd1 such that side surfaces of the dielectric capping layer 316 and side surfaces of the underlying heater pad 314 may form a first and second continuous surface extending along a second horizontal direction hd2. The first continuous surface and the second continuous surface may each contact the first switch dielectric material layer 312. In the embodiment shown in FIGS. 9A and 9B, the first continuous surface and the second continuous surface are each vertical surfaces, although it will be understood that the first continuous surface and the second continuous surface may be angled or curved surfaces that conform to the shape of the trench 604 (see FIG. 6) previously formed in the first switch dielectric material layer 312.

Figure 10:
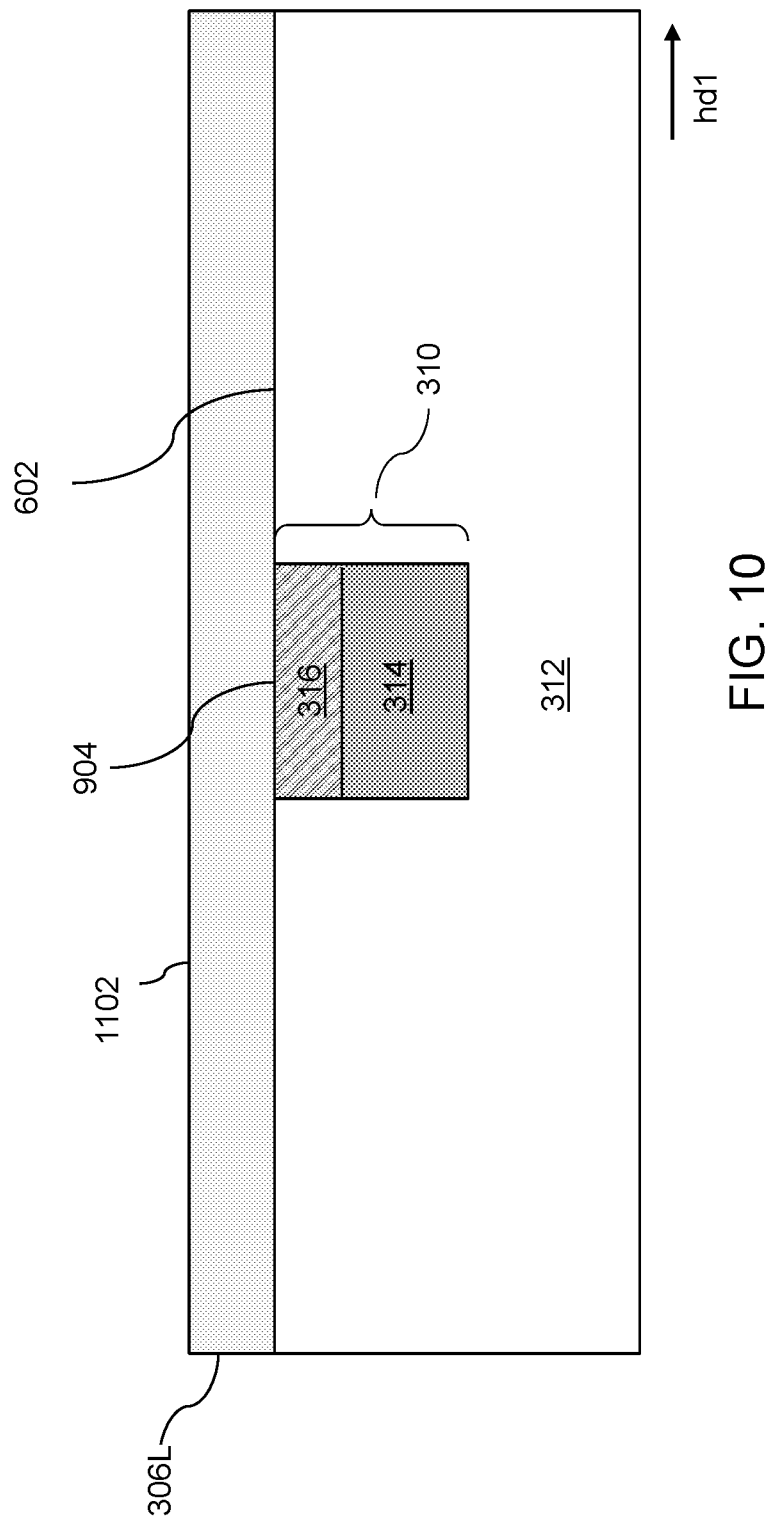
FIG. 10 is a vertical cross-section view of a further exemplary intermediate structure during a process of forming a PCM switch showing a continuous phase change material (PCM) layer formed over the upper surface of the first switch dielectric material layer and over the upper surface of the second dielectric material layer, according to various embodiments.

FIG. 10 is a vertical cross-section view of an exemplary intermediate structure during a process of forming a PCM switch showing a continuous phase change material (PCM) layer 306L formed over the upper surface 602 of the first switch dielectric material layer 312 and over the upper surface 904 of the dielectric capping layer 316, according to various embodiments. The continuous PCM layer 306L may be deposited over the upper surface of the first switch dielectric material layer 312 and over the upper surface 904 of the dielectric capping layer 316 using a suitable deposition process as described above. The continuous PCM layer 306L may include a suitable phase change material having at least two distinct phases providing different resistivity, such as a high resistivity amorphous phase and a low resistivity crystalline phase.

Suitable phase change materials for the continuous PCM layer 306L may include, without limitation, germanium telluride compounds, antimony telluride compounds, germanium antimony telluride (GST) compounds such as $Ge_2Sb_2Te_5$ or $GeSb_2Te_4$, germanium antimony compounds, indium germanium telluride compounds, aluminum selenium telluride compounds, indium selenium telluride compounds, and/or aluminum indium selenium telluride compounds. In some embodiments, the phase change material may be doped using a suitable dopant, such as indium or antimony, or the phase change material may be undoped. Other suitable materials for the continuous PCM layer 306L are within the contemplated scope of disclosure.

Figures 11A, 11B:
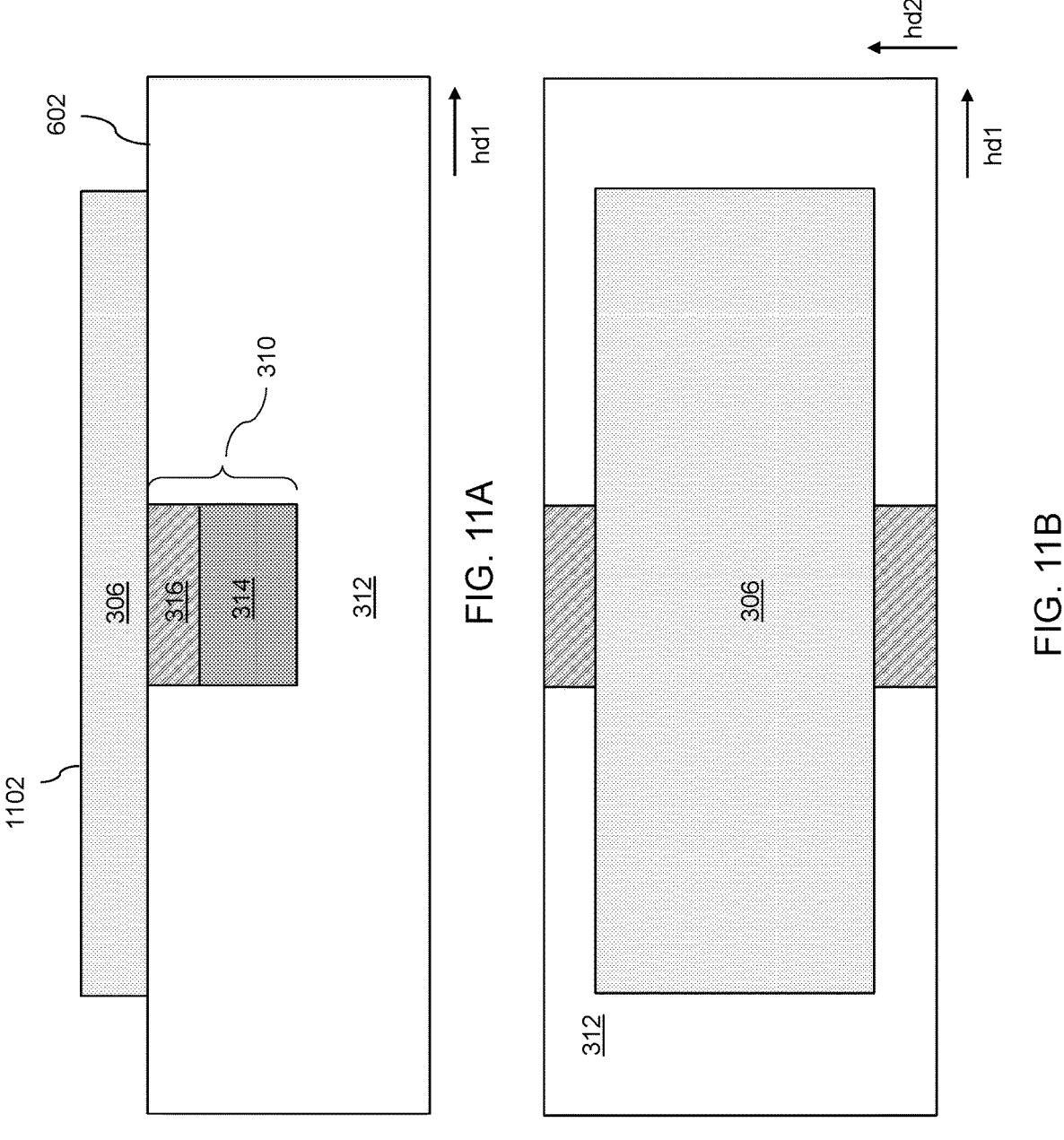
FIG. 11A is a vertical cross-section view of a further exemplary intermediate structure during a process of forming a PCM switch illustrating a discrete PCM layer over the upper surface of the first switch dielectric material layer and the upper surface of the dielectric capping layer, according to various embodiments.
FIG. 11B is a top view of the exemplary intermediate structure of FIG. 11A.

FIG. 11A is a vertical cross-section view of an exemplary intermediate structure during a process of forming a PCM switch illustrating a discrete PCM element 306 over the upper surface 602 of the first switch dielectric material layer 312 and the upper surface 904 of the dielectric capping layer 316, according to various embodiments. FIG. 11B is a top view of the exemplary intermediate structure of FIG. 11A. The PCM element 306 may be formed by performing an etching process, such as an anisotropic etching process, to remove portions of the continuous PCM layer 306L of FIG. 10. In this regard, a patterned mask (not shown) may be formed by depositing a layer of photoresist over the upper surface 1102 of the continuous PCM layer 306L, and lithographically patterning the photoresist to provide the patterned mask.

The patterned mask may cover a portion of the continuous PCM layer 306L overlying the dielectric capping layer 316 and the heater pad 314. The portion of the patterned mask overlying the dielectric capping layer 316 and the heater pad 314 may have a greater lateral dimension along a first horizontal direction hd1 than the dielectric capping layer 316 and the heater pad 314 along a first horizontal direction hd1 and may have a lesser lateral dimension than the dielectric capping layer 316 and the heater pad 314 along a second horizontal direction hd2 that is perpendicular to the first horizontal direction hd1.

The etching process may expose the upper surface 602 of the first switch dielectric material layer 312 and the upper surface 904 of the dielectric capping layer 316 surrounding the PCM element 306. In various embodiments, the PCM element 306 may have a greater lateral dimension along the first horizontal direction hd1 than the dielectric capping layer 316 and the heater pad 314 and may have a lesser lateral dimension than the dielectric capping layer 316 and the heater pad 314 along the second horizontal direction hd2 (e.g., see FIGS. 11A and 11B). Following the etching process, the patterned mask may be removed using a suitable process, such as via ashing or dissolution using a solvent.

Figures 12A, 12B:
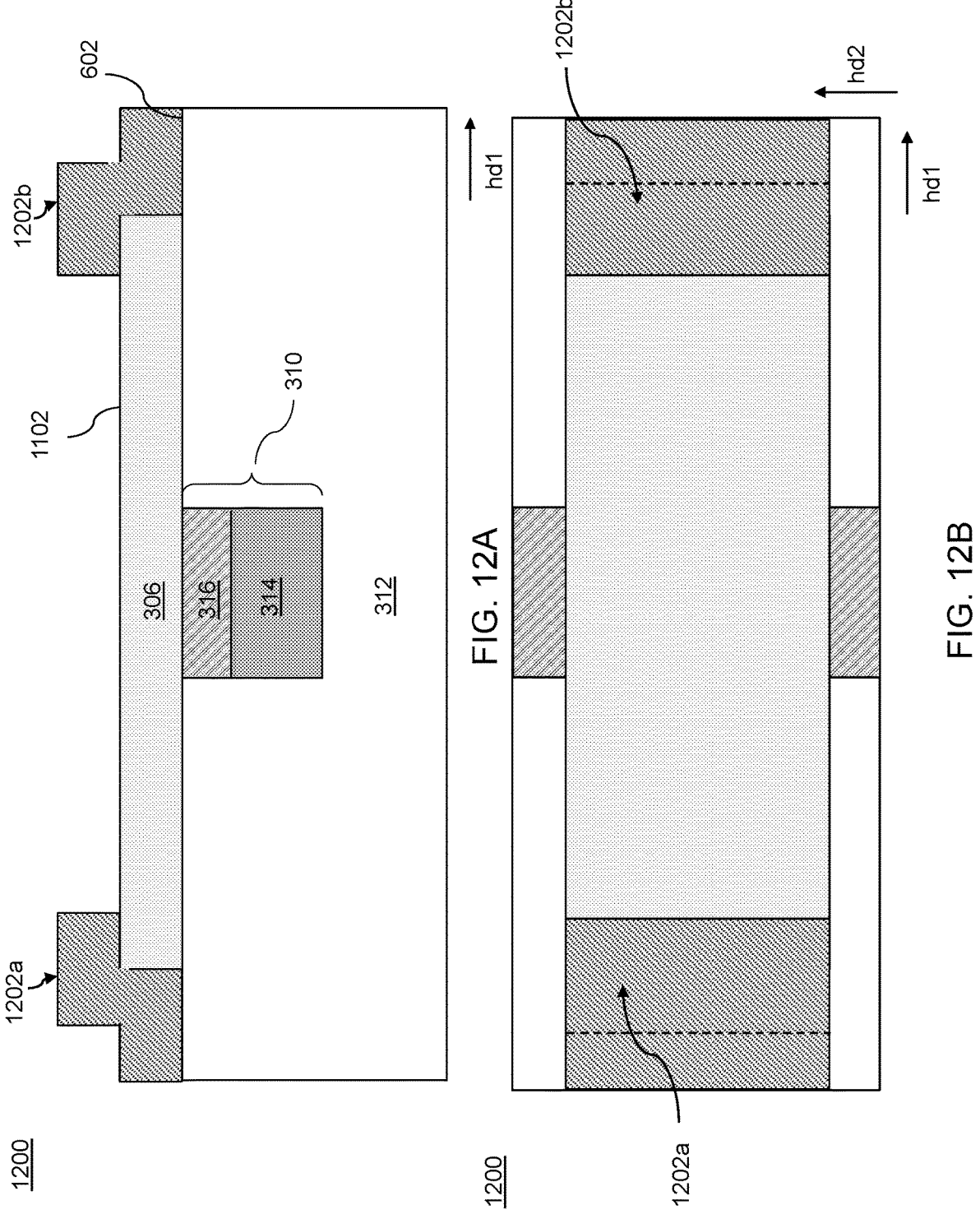
FIG. 12A is a vertical cross-section view of a PCM switch including first and second electrodes and over the upper surface of the first switch dielectric material layer and the upper surface and side surfaces of the PCM layer.
FIG. 12B is a top view of the PCM switch of FIG. 12A.

FIG. 12A is a vertical cross-section view of a PCM switch 1200 including a first electrode 1202a and a second electrode 1202b formed over the upper surface 602 of the first switch dielectric material layer 312 and the upper surface 1102 and side surfaces of the PCM element 306. FIG. 12B is a top view of the PCM switch 1200 of FIG. 12A. The PCM switch 1200 may be formed by deposition of a continuous electrode layer (not shown) followed by etching the continuous electrode layer to form the first electrode 1202a and a second electrode 1202b. In various embodiments, the first electrode 1202a and the second electrode 1202b may be electrically connected to the first RF conductor 304a and the second RF conductor, respectively (e.g., see FIGS. 3A and 4A).

The continuous electrode layer (not shown) may be formed by depositing an electrically conductive material over the exposed upper surfaces of the first switch dielectric material layer 312 and the dielectric capping layer 316 and over the upper surface and side surfaces of the PCM element 306. The continuous electrode layer may include a metallic material having relatively low electrical resistivity, such as tungsten, tungsten nitride, nickel silicide, and/or aluminum. Other suitable materials for the continuous electrode layer are within the contemplated scope of disclosure. The continuous electrode layer may be deposited using a suitable deposition process as described above.

A patterned mask (not shown) may then be formed over the continuous electrode layer by depositing a layer of photoresist over the continuous electrode layer, and lithographically patterning the photoresist to provide the patterned mask. The patterned mask may expose a region of the continuous electrode layer that overlies the heater pad 314 and the dielectric capping layer 316 and may cover portions of the continuous electrode layer that overlie peripheral regions of the PCM element 306 on opposite sides of the PCM element 306.

An etching process, such as an anisotropic etching process, may then be performed to remove portions of the continuous electrode layer that are exposed through the patterned mask and to generate discrete the first electrode 1202a and the second electrode 1202b over the upper surface 602 of the first switch dielectric material layer 312 and the upper surface 1102 and side surfaces of the PCM element 306. The etching process may expose a portion of the upper surface 1102 of the PCM element 306 between the first electrode 1202a and the second electrode 1202b.

Figure 13:
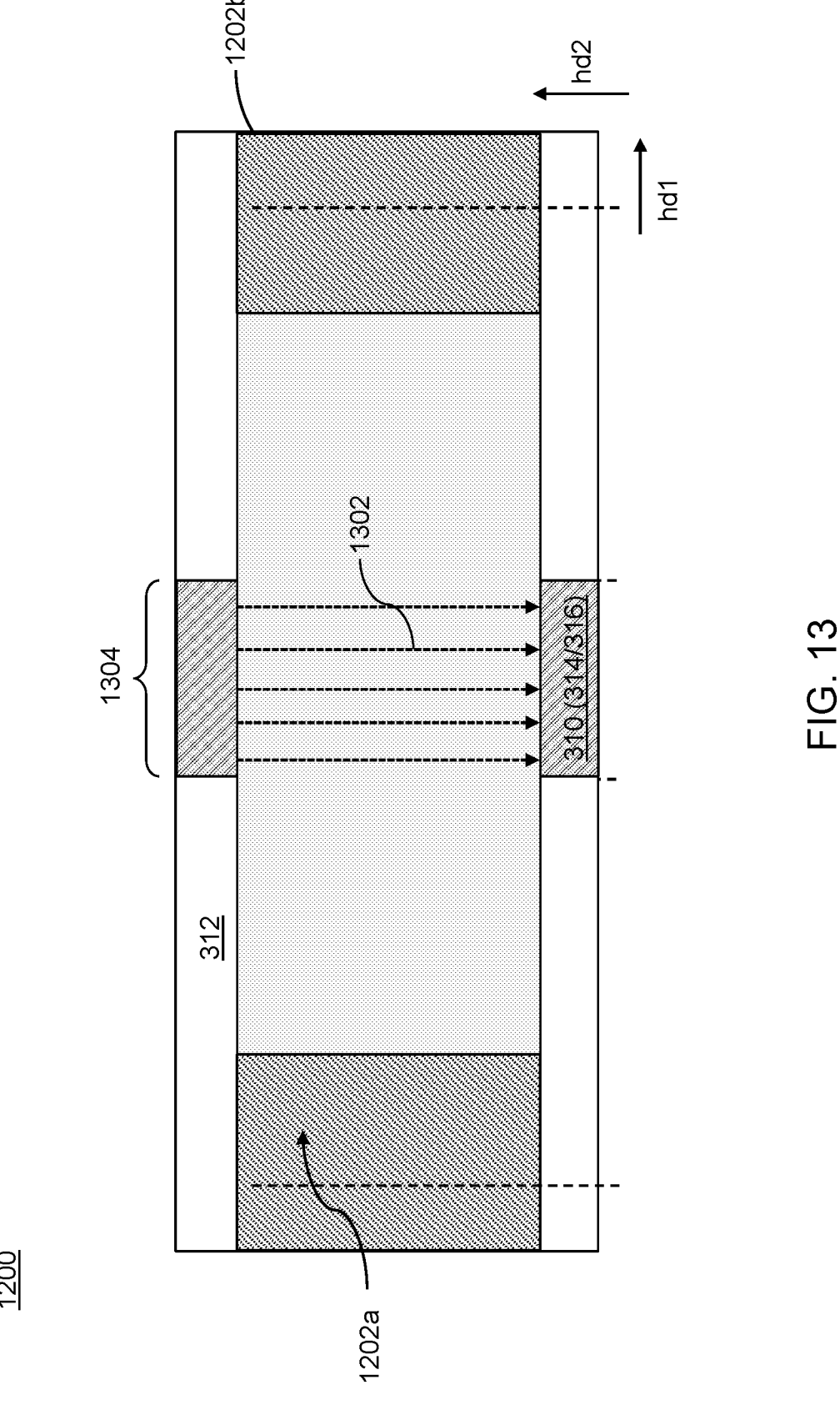
FIG. 13 is a top view of a PCM switch schematically illustrating a process of switching the PCM switch between different resistivity states, according to various embodiments.

FIG. 13 is a top view of the PCM switch 1200 schematically illustrating a process of switching the PCM switch 1200 between different resistivity states, according to various embodiments. Referring to FIG. 13, a bias voltage may be selectively applied across the heater pad 314 through electrical connections between the heating element 310 and the first heater pad 308a and the second heater pad 308b (e.g., see FIG. 3A). The application of the bias voltage across the heater pad 314 may induce a current to flow through the heater pad 314 and beneath the PCM element 306, as schematically indicated by arrows 1302 in FIG. 13. The current flow through the heater pad 314 causes the heating pad to heat up via resistive heating. A portion of the thermal energy generated in the heater pad 314 may be transferred through the dielectric capping layer 316 to heat the PCM element 306.

By controlling the characteristics of the current pulse flowing through the heater pad 314, the thermal profile within a portion 1304 of the PCM element 306 overlying the heater pad 314 (which may also be referred to as the "active region" 1304 of the PCM element 306) may be controlled. For example, a current pulse having a relatively short pulse width and rapid pulse falling time may quickly heat the active region 1304 of the PCM element 306 above its melting temperature ($T_{melt}$), causing the active region 1304 of the PCM element 306 to transition from a low-resistivity state to a high-resistivity state, while the rapid falling time of the current pulse may cause the active region 1304 of the PCM element 306 to rapidly quench and avoid recrystallization as it cools. Thus, the active region 1304 of the PCM element 306 may retain its high resistivity state indefinitely following the application of the current pulse.

In contrast, a current pulse having a relatively longer pulse width and longer falling time may heat the active region 1304 of the PCM element 306 to a temperature above its crystallization temperature ($T_{crys}$), but below its melting temperature ($T_{melt}$), causing the active region 1304 of the PCM element 306 to undergo crystal nucleation, while the long falling time of the current pulse may promote crystal growth in the active region 1304 of the PCM element 306 as it gradually cools, thereby causing the active region 1304 of the PCM element 306 to transition from a high-resistivity state to a low-resistivity state. The active region 1304 of the PCM element 306 may retain this low resistivity state indefinitely until the application of a subsequent current pulse that is configured to transition the active region 1304 to a high-resistivity state.

In some embodiments, the first heater pad 308a and the second heater pad 308b that are connected to the heater pad 314 may be electrically coupled to control circuitry configured to selectively control the application of current pulses through the heater pad 314 and thereby control (i.e., program) the resistance state of the active region 1304 of the PCM element 306. For example, one or both of first heater pad 308a and the second heater pad 308b may be coupled to one or more transistors 532 via metal interconnect structures (508, 510, 514, 516, 520, 522, 526, 528) as shown in FIG. 5.

Figure 14:
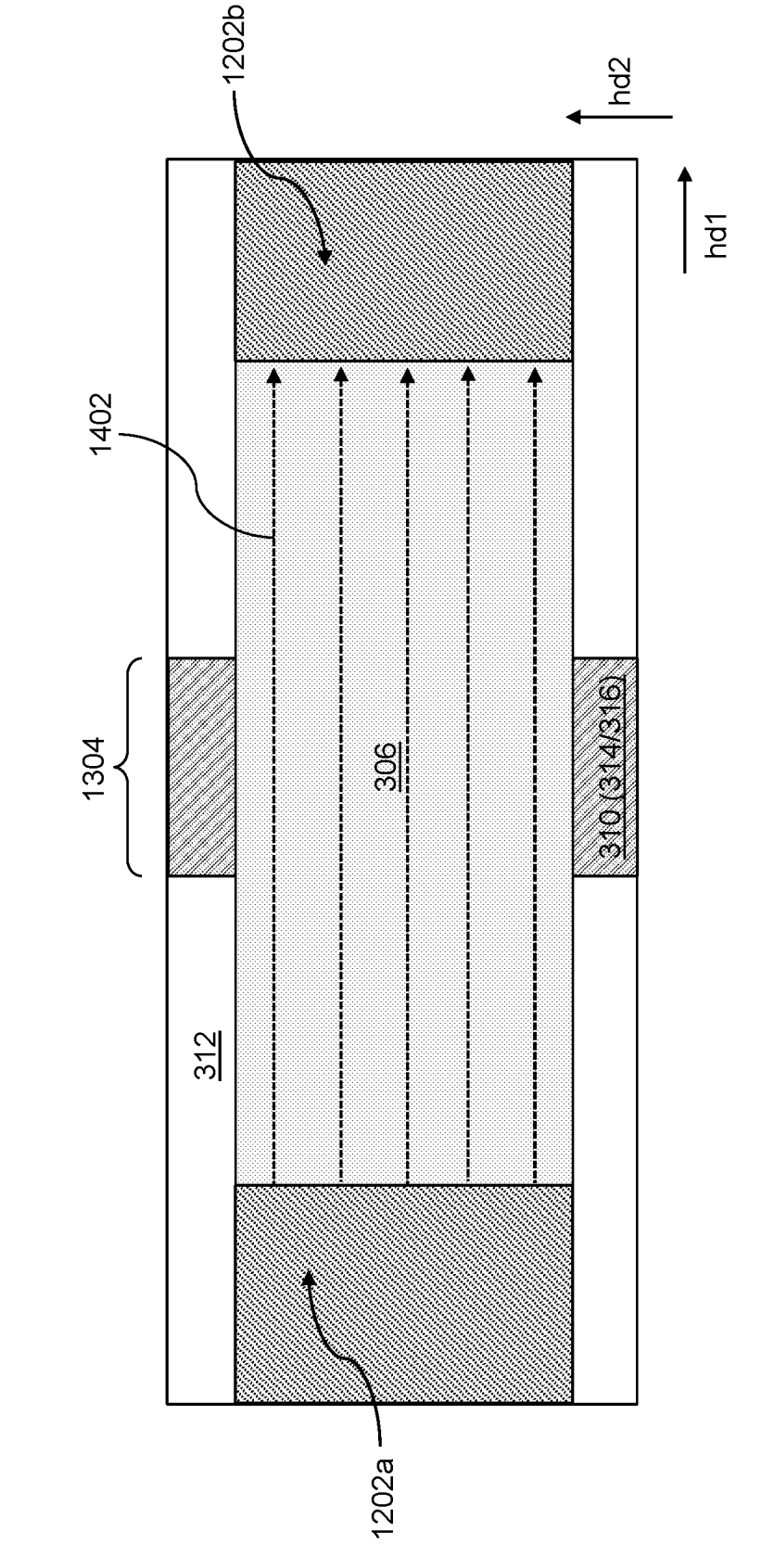
FIG. 14 is a top view of a PCM switch schematically illustrating a signal pathway across the PCM switch according to an embodiment of the present invention.

FIG. 14 is a top view of a PCM switch 1200 schematically illustrating a signal pathway across the PCM switch 1200 according to various embodiments. In this regard, an input signal, such as a radiofrequency (RF) signal, may be transmitted to the first electrode 1202a from the first RF conductor 304a (e.g., see FIGS. 3A and 4A). In instances in which the active region 1304 of the PCM element 306 is in a low-resistivity state, the PCM switch 1200 is "On," (i.e., the PCM switch is closed) and the signal may be transmitted across the PCM element 306 to the second electrode 1202b and to the RF conductor 304b (e.g., see FIGS. 3A and 4A), as schematically indicated by arrows 1402. In instances in which the active region 1304 of the PCM layer 1002 is in a high-resistivity state, the PCM switch 1200 is "Off" (i.e., the PCM switch is open) and the signal transmission to the second electrode 1202b and to the second RF conductor 304b may be blocked.

Figure 15:
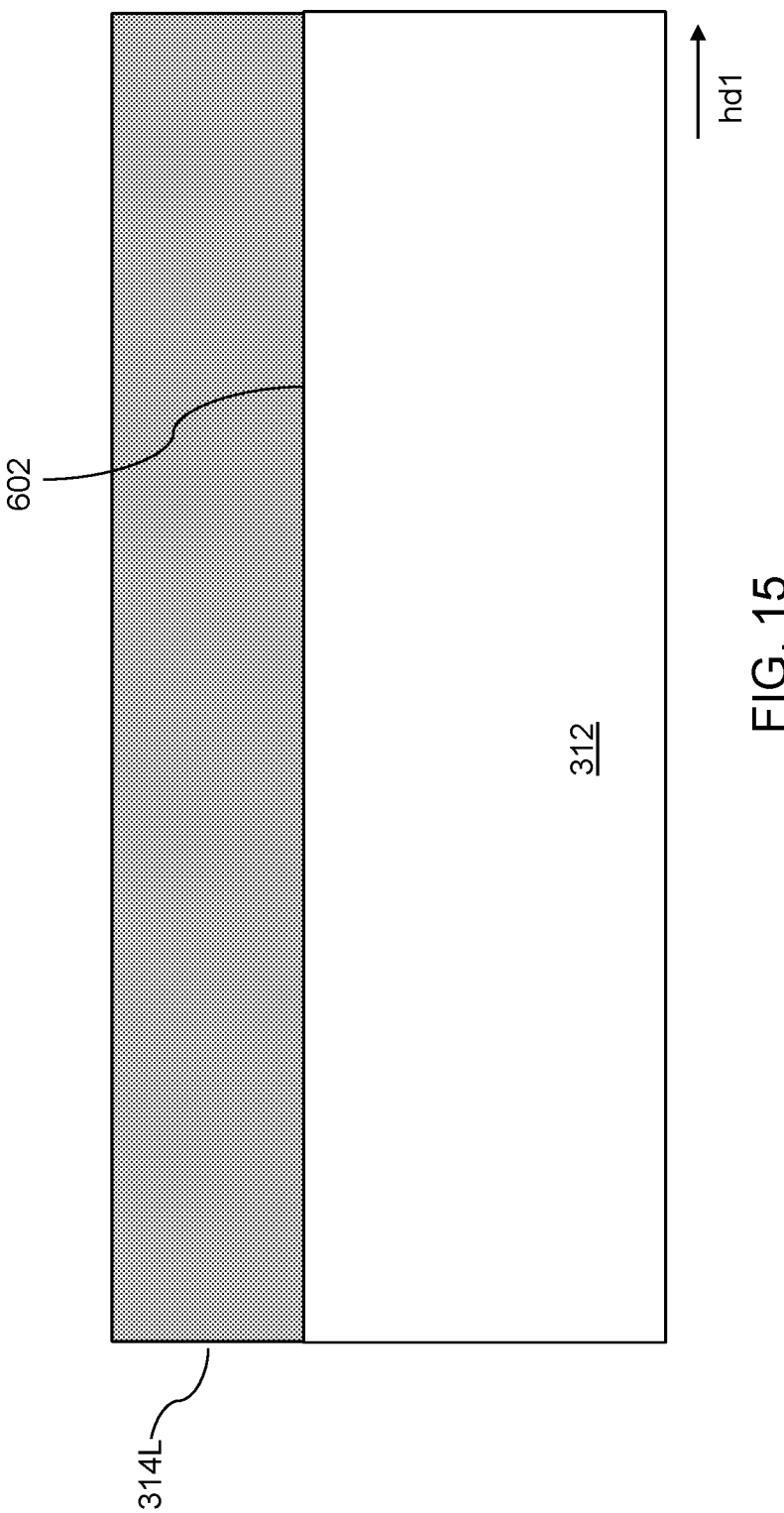
FIG. 15 is a vertical cross-section view of an exemplary intermediate structure during a process of forming a PCM switch illustrating a continuous heater material layer deposited over the upper surface of a lower dielectric material layer, according to various embodiments.
Figure 16:
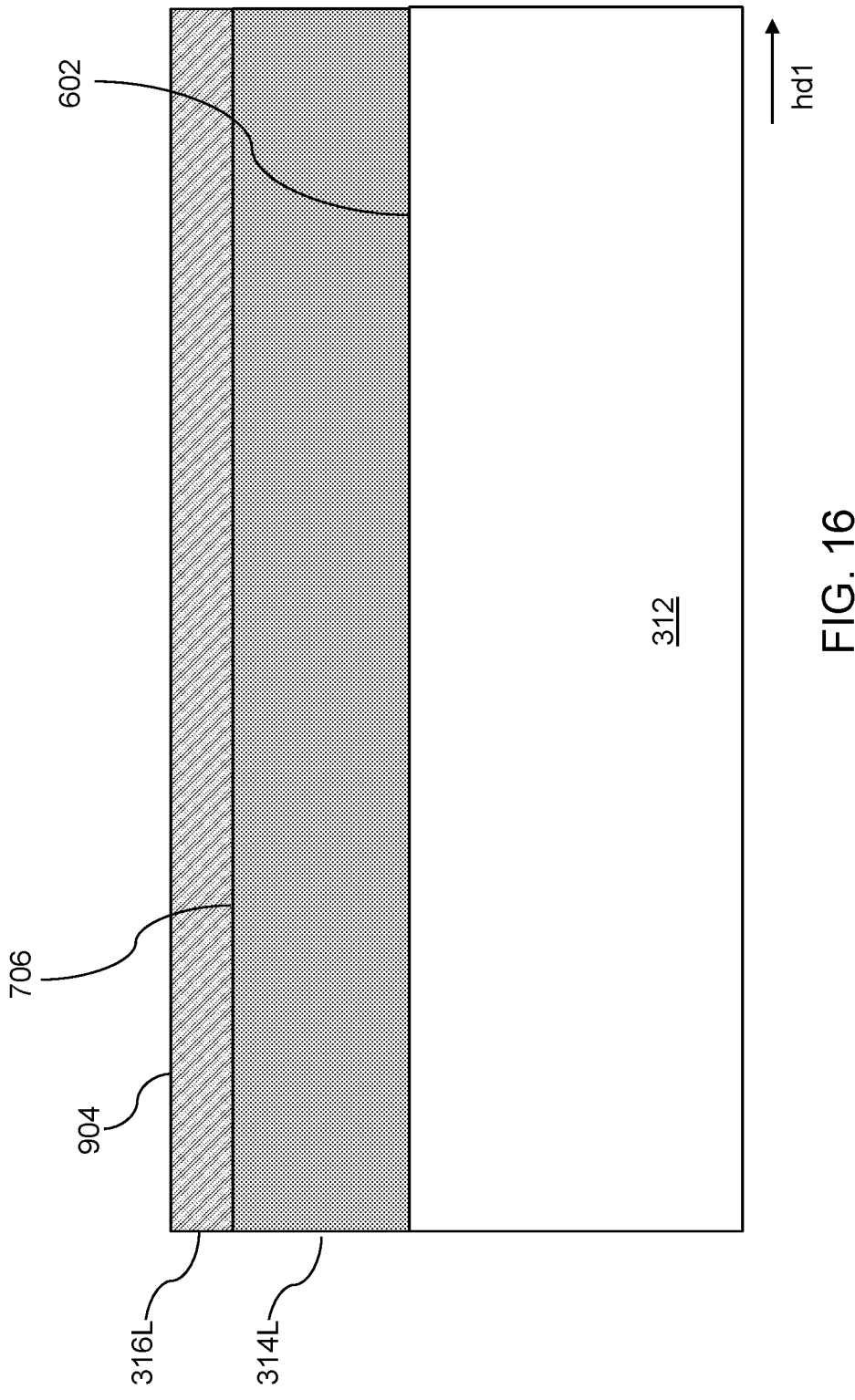
FIG. 16 is a vertical cross-section view of a further exemplary intermediate structure during a process of forming a PCM switch illustrating a continuous dielectric capping layer deposited over the upper surface of the continuous heater material layer, according to various embodiments.

FIGS. 15-19 are sequential vertical cross-section views of an exemplary intermediate structure during a process of forming an embodiment PCM switch illustrating an alternative process for forming a heater pad 314 and a laterally-confined dielectric capping layer 316 over the heater pad 314, according to various embodiments. Referring to FIG. 15, a continuous heater material layer 314L may be deposited over the upper surface 602 of the first switch dielectric material layer 312 (e.g., see FIG. 5). Unlike in the exemplary intermediate structure shown in FIG. 6, the continuous heater material layer 314L may be deposited over a planar upper surface 602 of the first switch dielectric material layer 312 that does not include a trench in the location of a PCM switch to be subsequently formed. Referring to FIG. 16, a continuous dielectric capping layer 316L may be deposited over the upper surface 706 of the continuous heater material layer 314L.

Figure 17:
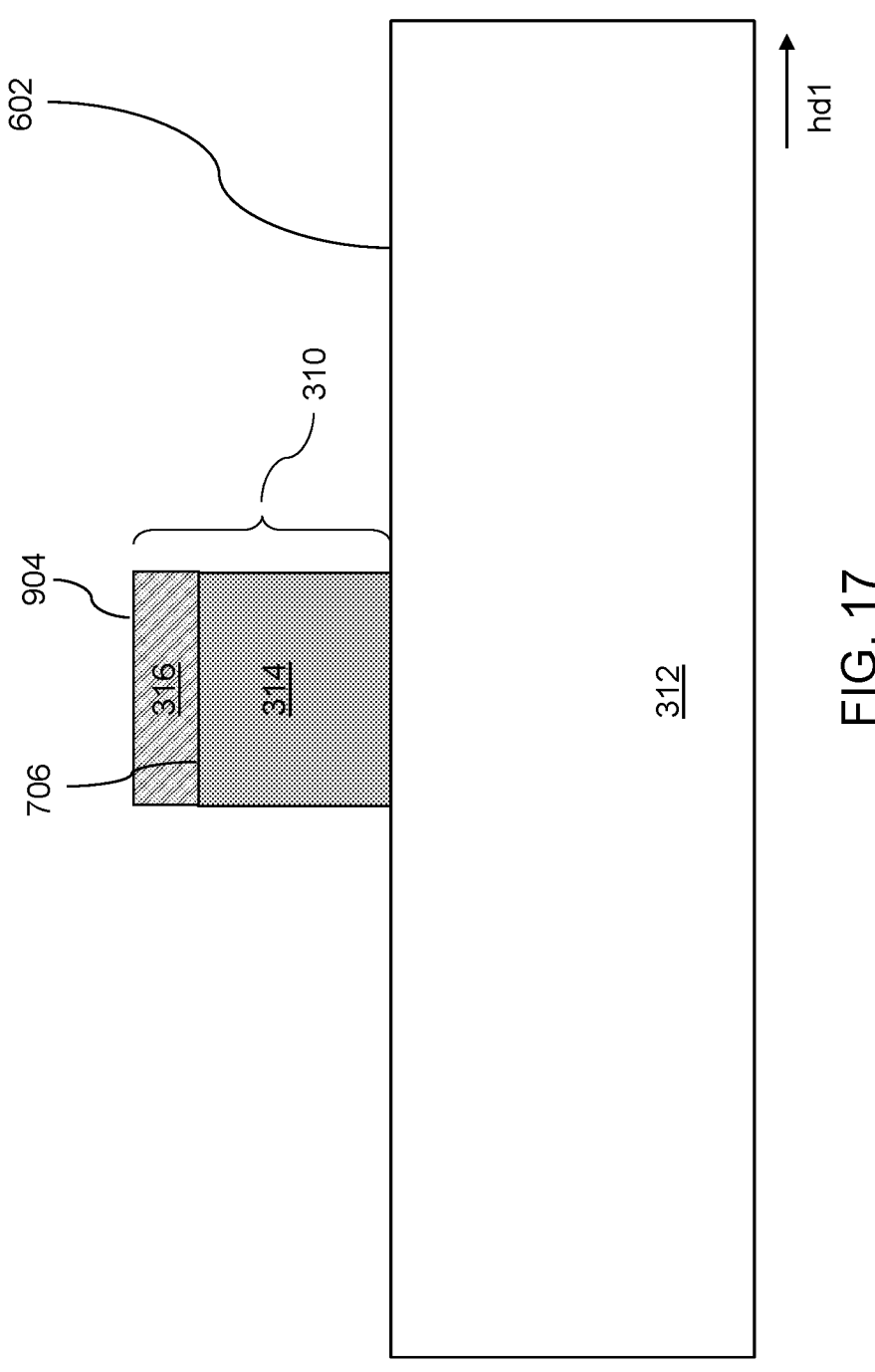
FIG. 17 is a vertical cross-section view of a further exemplary intermediate structure during a process of forming a PCM switch illustrating a heater pad formed over the upper surface of the lower dielectric material layer, and a dielectric capping layer over the upper surface of the of the heater pad, according to various embodiments.

FIG. 17 is a vertical cross-section view of an exemplary intermediate structure during a process of forming a PCM switch illustrating a heater pad 314 formed over the upper surface 602 of the first switch dielectric material layer 312, and a dielectric capping layer 316 over the upper surface of the 706 of the heater pad 314, according to various embodiments. In this regard, an etching process may be performed on the exemplary intermediate structure of FIG. 16 to generate the heater pad 314 and the dielectric capping layer 316 over the upper surface of the 706 of the heater pad 314, thereby forming the heating element 310. In this regard, a patterned mask (not shown) may be formed by depositing a layer of photoresist over the upper surface 904 of the continuous dielectric capping layer 316L (e.g., see FIG. 16), and lithographically patterning the photoresist to provide the patterned mask. The patterned mask may cover a portion of the continuous dielectric capping layer 316L corresponding to the location of a heater pad and discrete dielectric capping layer to be subsequently formed. An anisotropic etching process may be performed to etch unmasked portions of the continuous dielectric capping layer 316L and the continuous heater material layer 314L to provide a discrete heater pad 314 over the upper surface 602 of the first switch dielectric material layer 312, and a discrete dielectric capping layer 316 over the upper surface of the 706 of the heater pad 314.

The dielectric capping layer 316 and the heater pad 314 and may be similar to the embodiment shown in FIG. 9A in that side surface of the dielectric capping layer 316 and side surface of the underlying heater pad 314 may form a first continuous surface, and side surface of the dielectric capping layer 316 and side surface of the underlying heater pad 314 may form a second continuous surface. Following the etching process, the patterned mask may be removed using a suitable process, such as via ashing or dissolution using a solvent.

Figure 18:
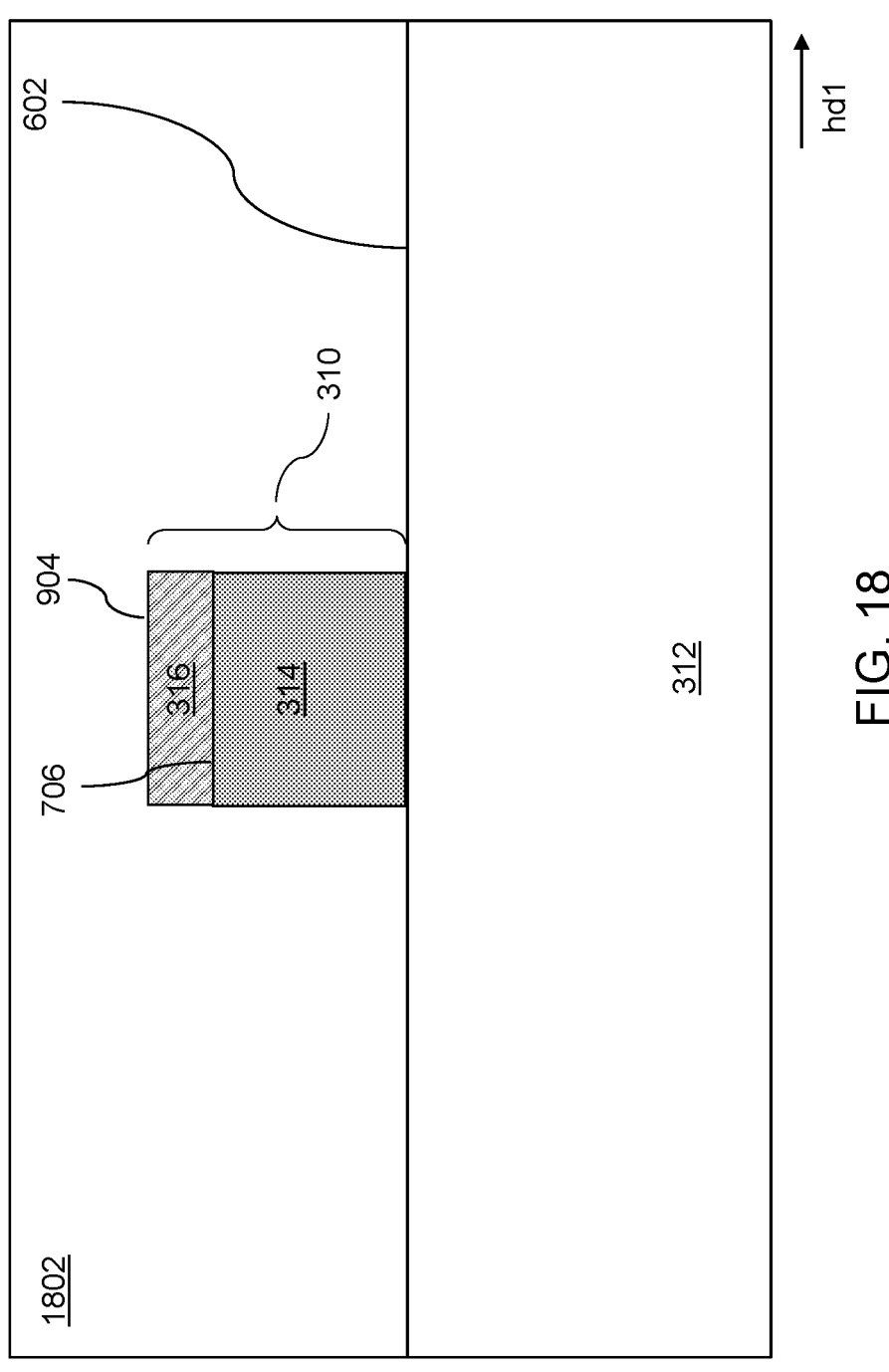
FIG. 18 is a vertical cross-section view of a further exemplary intermediate structure during a process of forming a PCM switch illustrating an upper dielectric material layer formed over the upper surface of the lower dielectric material layer, over the side surfaces of the heater pad, and over the upper surface and side surfaces of the dielectric capping layer, according to various embodiments.

FIG. 18 is a vertical cross-section view of an exemplary intermediate structure during a process of forming a PCM switch illustrating an upper dielectric material layer 1802 formed over the upper surface 602 of the first switch dielectric material layer 312, over the side surfaces of the heater pad 314, and over the upper surface 904 and side surfaces and of the dielectric capping layer 316, according to various embodiments. Referring to FIG. 18, the upper dielectric material layer 1802 may include a suitable dielectric material and may be deposited using a suitable deposition process as described above. In some embodiments, the upper dielectric material layer 1802 may have the same composition as the first switch dielectric material layer 312. Alternatively, the upper dielectric material layer 1802 may have a different composition than the first switch dielectric material layer 312.

Figure 19:
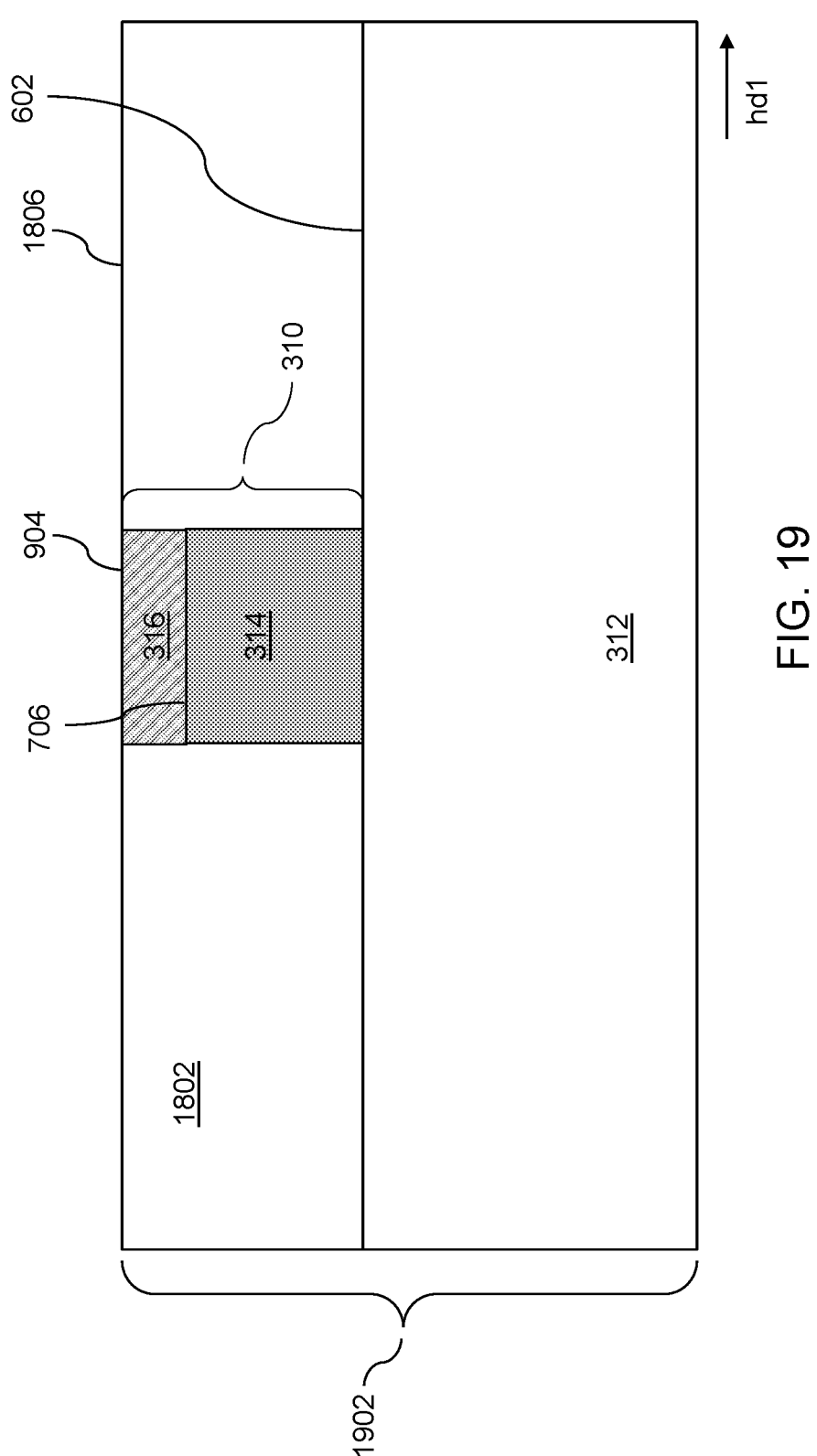
FIG. 19 is a vertical cross-section view of a further exemplary intermediate structure during a process of forming a PCM switch following a planarization process that removes a portion of the upper dielectric material layer from over the upper surface of the dielectric capping layer, according to various embodiments.

FIG. 19 is a vertical cross-section view of an exemplary intermediate structure during a process of forming a PCM switch following a planarization process that removes a portion of the upper dielectric material layer 1802 from over the upper surface 904 of the dielectric capping layer 316, according to various embodiments. Referring to FIG. 19, a planarization process, such as a chemical mechanical planarization (CMP) may be used to remove a portion of the upper dielectric material layer 1802 from over the upper surface 904 of the dielectric capping layer 316. Following the planarization process, an upper surface 1806 of the upper dielectric material layer 1802 may be co-planar with the upper surface 904 of the dielectric capping layer 316. The first switch dielectric material layer 312 and the upper dielectric material layer 1802 may together form a second switch dielectric material layer 1902 such as shown in FIG. 19, where the first switch dielectric material layer 312 may contact the lower surface of the heater pad 314 and the upper dielectric material layer 1802 may laterally surround the heater pad 314 and the dielectric capping layer 316. The processing steps described above with reference to FIGS.

10-12B may then be performed to form a PMC switch 1200 in accordance with an embodiment of the present disclosure.

Figure 20:
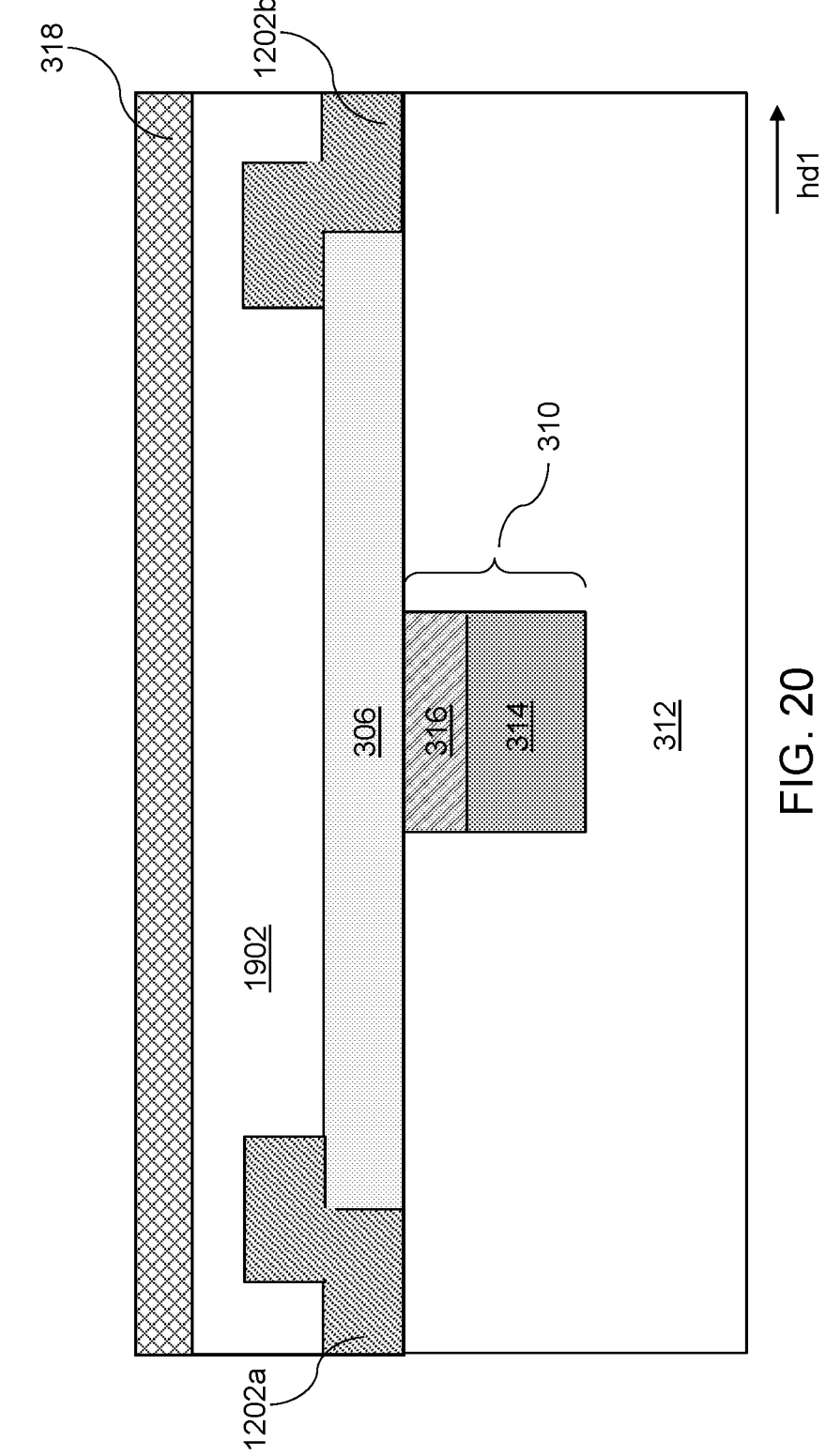
FIG. 20 is a vertical cross-sectional view of a PCM switch including a spreading layer, according to various embodiments.

FIG. 20 is a vertical cross-sectional view of a PCM switch 2000 including a heat spreader 318, according to various embodiments. The PCM switch 2000 may be similar to the PCM switch 400 described above with reference to FIG. 4B. The PCM switch 2000 of FIG. 20 may be formed by depositing a second switch dielectric material layer 1902 over the PCM switch 1200 of FIGS. 12A and 12B. In this regard, processing operations described above with reference to FIGS. 10 to 12B may be performed to form the PCM element 306 and the first electrode 1202a and 1202b over a starting structure (e.g., see FIGS. 9A, 9B, and 19). After deposition of the dielectric material layer 1902, a planarization process (e.g., CMP) may then be performed to generate a planar top surface to the second switch dielectric material layer 1902. The heat spreader 318 may then be formed by deposition of a heat-conducting material over the second switch dielectric material layer 1902. For example, the heat conducting material may be a metal or a compound semiconductor (e.g., SiC) having a high thermal conductivity (e.g., >100 W/mK). The heat spreader 318 may be configured to remove heat from the PCM element during a cool-down phase after a switching event (e.g., switching from insulating to conducting or from conducting to insulating), as described above.

Figure 21:
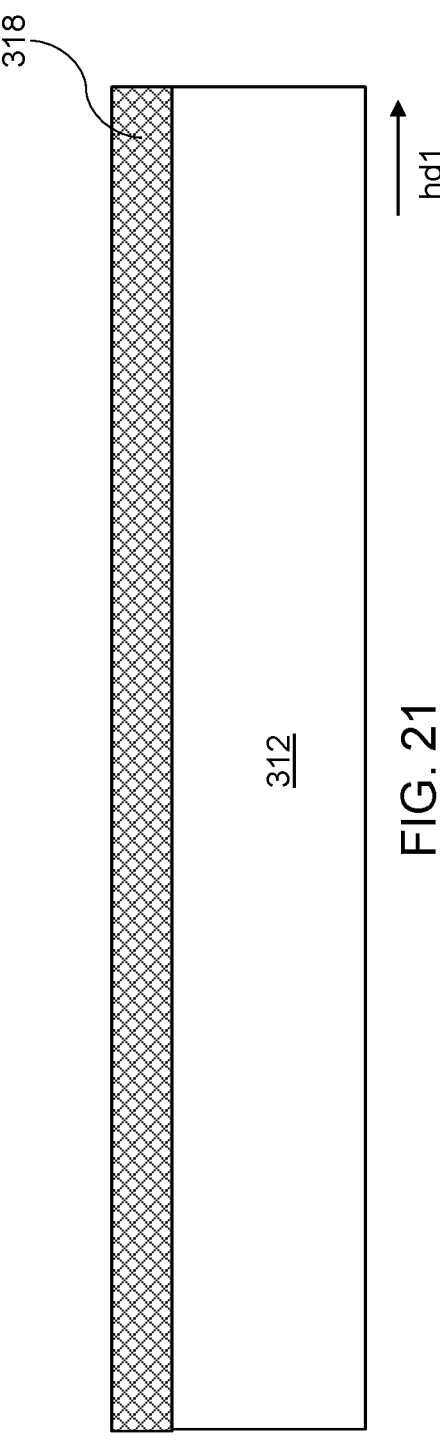
FIG. 21 is a vertical cross-sectional view of an intermediate structure that may be used in the formation of a PCM switch including a spreading layer, according to various embodiments.
Figure 22:
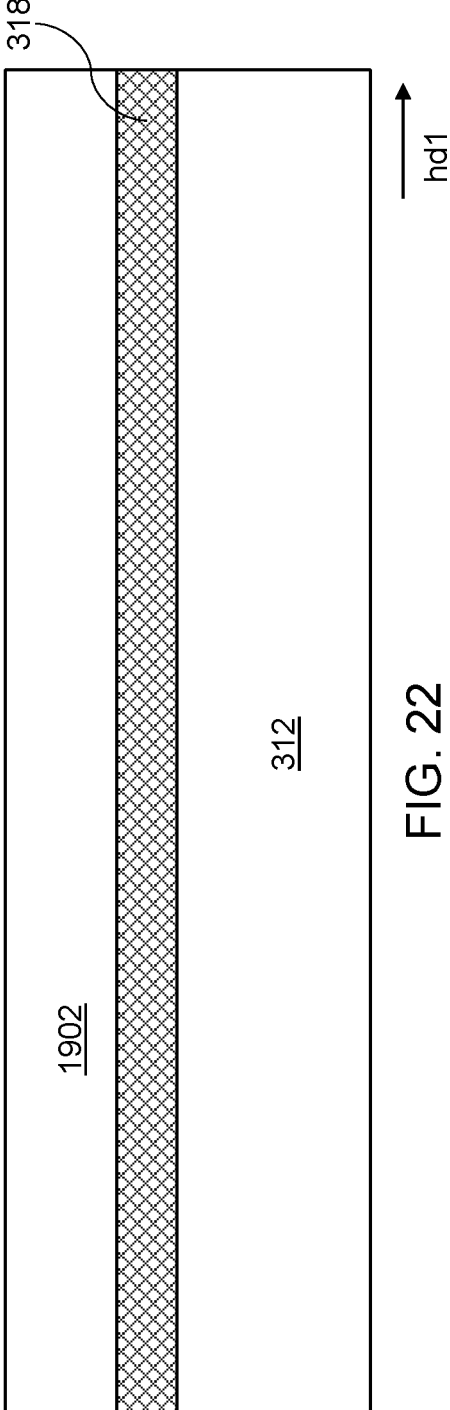
FIG. 22 is a vertical cross-sectional view of a further intermediate structure that may be used in the formation of a PCM switch including a spreading layer, according to various embodiments.
Figure 23:
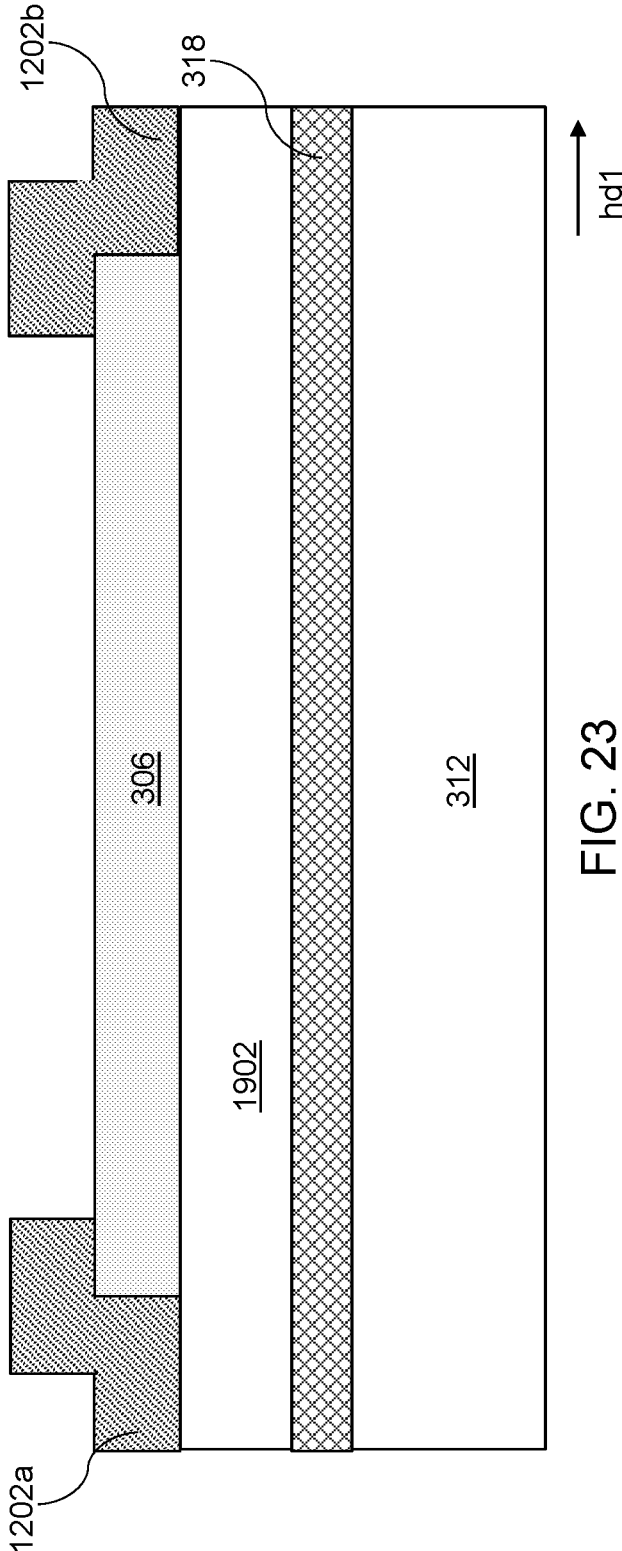
FIG. 23 is a vertical cross-sectional view of a further intermediate structure that may be used in the formation of a PCM switch including a spreading layer, according to various embodiments.
Figure 24:
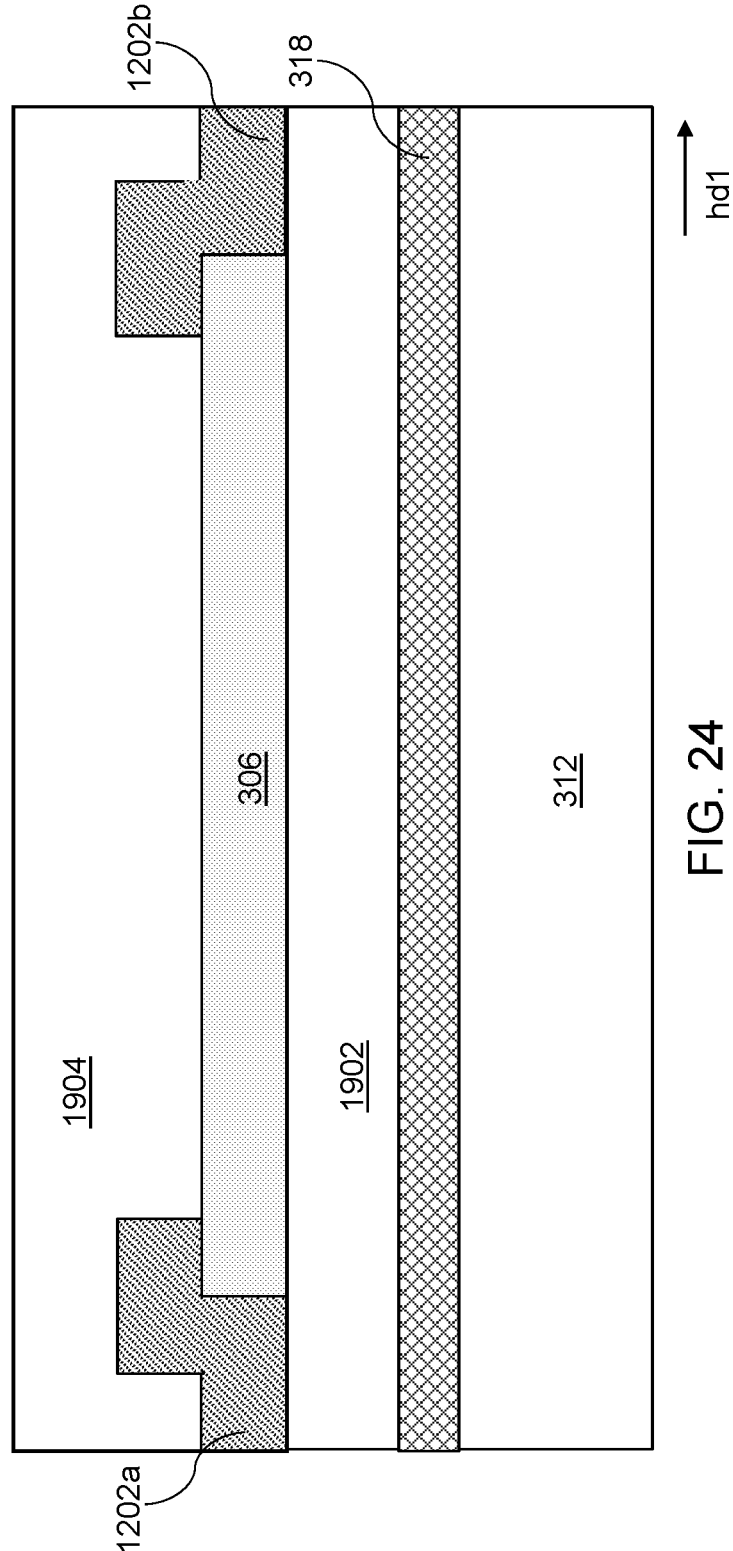
FIG. 24 is a vertical cross-sectional view of a further intermediate structure that may be used in the formation of a PCM switch including a spreading layer, according to various embodiments.
Figure 25:
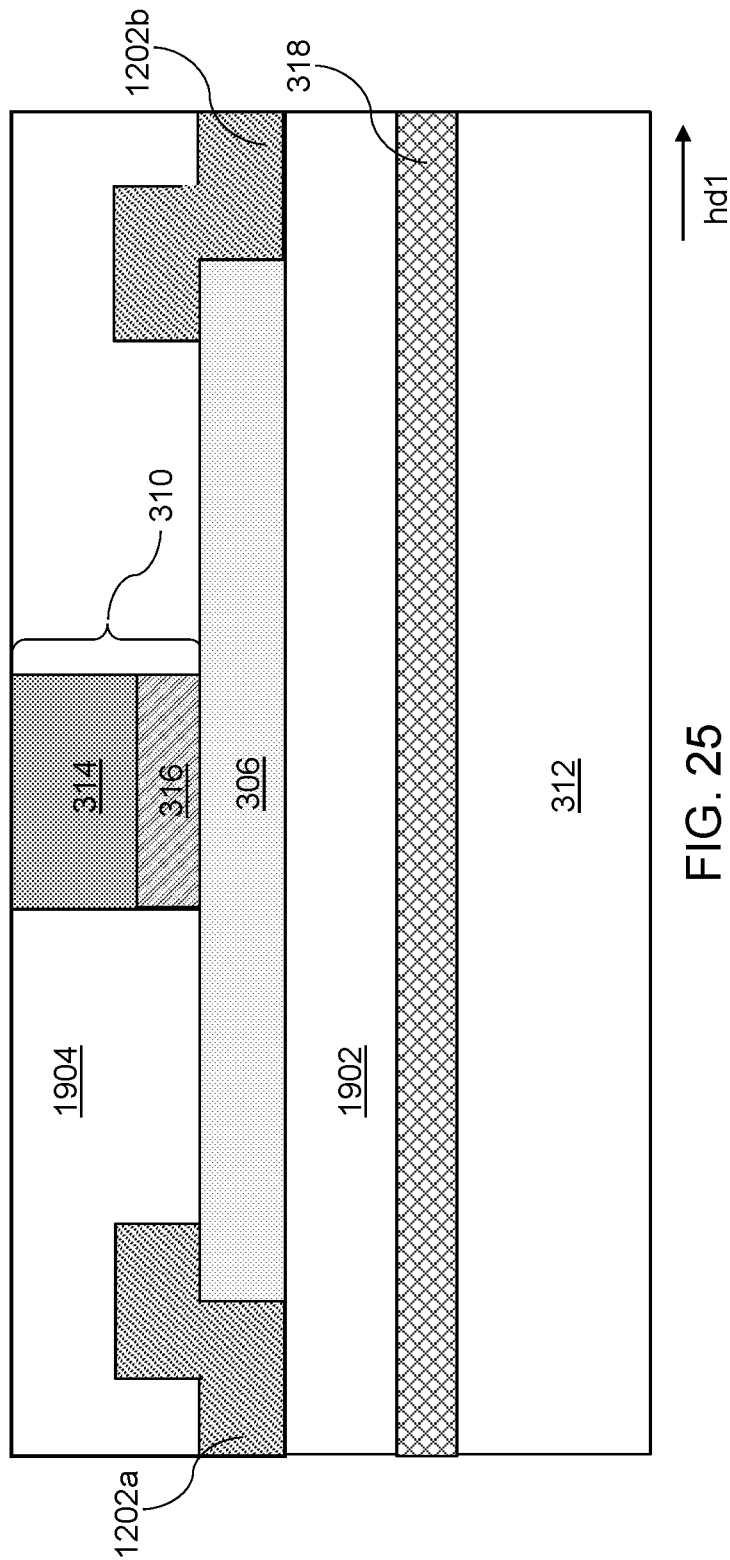
FIG. 25 is a vertical cross-sectional view of a PCM switch including a spreading layer including a spreading layer, according to various embodiments.

FIGS. 21 to 24 are vertical cross-sectional views of intermediate structures 2100 to 2400, respectively, which may be used in the formation of a further PCM switch 2500 including a heat spreader 318, as shown in FIG. 25, according to various embodiments. The PCM switch 2100 may be formed by reversing some of the processing steps that lead to the PCM switch 2000. In this regard, the heat spreader 318 may be first formed over the first switch dielectric material layer 312 as shown in FIG. 21. A second switch dielectric material layer 1902 may then be formed over the heat spreader 318 and a planarization process may be performed to generate a planar top surface of the second switch dielectric material layer 1902, as shown in FIG. 22.

As shown in FIG. 23, the PCM element 306, the first electrode 1202a, and the second electrode 1202b may then be formed over the second switch dielectric material layer 1902 using processes similar to those described above with reference to FIGS. 10 to 12. Referring to FIG. 24, a third switch dielectric material layer 1904 may then be deposited over the PCM element 306, the first electrode 1202a, and the second electrode 1202b, and a planarization process may be performed to provide a planar surface over the top of the third switch dielectric material layer 1904. Referring to FIG. 25, the heater pad 314 and the capping layer 316, forming the heating element 310, may then be formed over the PCM element using processes similar to those described above with reference to FIGS. 6 to 9B. The resulting structure is the further embodiment PCM switch 2500, as shown in FIG. 2500. The PCM switch 2500 is similar to the PCM switch 300 described above with reference to FIG. 3B.

FIG. 26A is a flowchart illustrating operations of an embodiment method 2600a of fabricating a PCM switch 2000 (e.g., see FIG. 20), according to various embodiments. In operation 2602a, the method 2600a may include forming a heating element 310 within a first dielectric layer 312 such that the heating element 310 is partially surrounded by the first dielectric layer 312 except for an exposed top surface 904 (e.g., see FIGS. 9A and 19) of the heating element 310. In operation 2604a, the method 2600a may include forming a phase change material element 306 over the first dielectric layer 312 and over the exposed top surface 904 of the heating element 310 (e.g., see FIGS. 11A and 11B) such that the heating element 310 generates and supplies heat to the phase change material element 306 when an applied voltage generates a current through the heating element 310.

In operation 2606a, the method 2600a may include forming a first electrode 1202a and a second electrode 1202b in contact with the phase change material element 306 (e.g., see FIGS. 12A and 12B). In operation 2608a, the method 2600a may include forming a second dielectric layer 1902 over the phase change material element 306 and over the first electrode 1202a and the second electrode 1202b (e.g., see FIG. 20). In operation 2610a, the method 2600a may include forming a heat spreader 318 over the second dielectric layer 1902 (e.g., see FIG. 20).

FIG. 26B is a flowchart illustrating operations of a further embodiment method 2600b of fabricating a PCM switch 2500 (e.g., see FIG. 25), according to various embodiments. In operation 2602b, the method 2600b may include forming a heat spreader 318 over a first dielectric layer 312 (e.g., see FIG. 21). In operation 2604b, the method 2600b may include forming a second dielectric layer 1902 over the heat spreader 318 (e.g., see FIG. 22).

In operation 2606b, the method 2600b may include forming a phase change material element 306 over the second dielectric layer 1902 (e.g., see FIG. 23). In operation 2608b, the method 2600b may include forming a first electrode 1202a and a second electrode 1202b in contact with the phase change material element 306 (e.g., see FIG. 23). In operation 2610b, the method 2600b may include forming a heating element 310 over the phase change material element 306 such that the heating element 310 generates and supplies heat to the phase change material element 306 when an applied voltage generates a current through the heating element 310 (e.g., see FIG. 25).

As described above, the phase change material element 306 may include a phase change material that switches from an electrically conducting phase to an electrically insulating phase by application of a heat pulse by the heating element 310. Further, the first electrode 1202a, the second electrode 1202b, the heating element 310, and the phase change material element 306, form an RF PCM switch (300, 400, 1200, 2000, 2100) that blocks RF signals when the phase change material element 306 is the electrically insulating phase and conducts RF signals when the when the phase change material element 306 is in the electrically conducting phase.

The methods (2600a, 2600b) may further include forming an electrically conducting heater pad 314 that generates heat when the applied voltage generates the current through the electrically conducting heater pad 314. The methods (2600a, 2600b) may further include forming a dielectric capping layer 316 that is in contact with the phase change material element 306 and that separates the electrically conducting heater pad 314 from the phase change material element 306. According to the methods (2600a, 2600b), forming the heat spreader 318 may further include forming an electrically insulating material (1902, 1904) (e.g., see FIGS. 20 and 21) over the phase change material element 306 and forming the heat spreader 318 as a metal or a compound semiconductor over the electrically insulating material (1902, 1904) such that the heat spreader 318 is electrically isolated from the phase change material element 306 and the heating element 310.

Referring to all drawings and according to various embodiments of the present disclosure, a PCM switch (300, 400, 1200, 2000, 2100) is provided. The PCM switch (300, 400, 1200, 2000, 2100) may include a phase change material element 306 having a first electrode 1202*a* and a second electrode 1202*b*; a heating element 310 coupled to a first side (e.g., see FIGS. 4B, 20, and 21) of the phase change material element 306 and configured to supply a heat pulse to the phase change material element 306; and a heat spreader 318 formed on a second side of the phase change material element 306 opposite to the heating element (e.g., see FIGS. 4B, 20, and 21). The phase change material element 306 may include a phase change material that switches from an electrically conducting phase to an electrically insulating phase by application of the heat pulse by the heating element 310.

The heat spreader 318 may include a metal or a compound semiconductor having a thermal conductivity greater than 100 W/mK. The heat spreader 318 may also include Cu or SiC. The heat spreader 318 may further be electrically isolated from the heating element 310 and the phase change material element 306 (e.g., see FIGS. 4B, 20, and 21). The heat spreader 318 may further be separated from the phase change material element 306 by an electrically insulating material (1902, 1904) having a thermal conductivity in a range from approximately 0.1 W/mK to approximately 50 W/mK.

The phase change material element 306 may include a material having a thermal conductivity in a range from approximately 2.5 W/mK to approximately 10 W/mK. The phase change material element 306 may include at least one of a germanium telluride compound, an antimony telluride compound, a germanium antimony telluride compound, a germanium antimony compound, an indium germanium telluride compound, an aluminum selenium telluride compound, an indium selenium telluride compound, and an aluminum indium selenium telluride compound.

In some embodiments, the heating element 310 may include a heater pad 314 that generates heat when an applied voltage generates a current through the heater pad 314. The heater pad 314 may further include a material that is at least one of tungsten, tungsten nitride, titanium nitride, and a nickel silicide. Further, the heater pad 314 may include a material having a thermal conductivity greater than 175 W/mK. The PCM switch (300, 400, 1200, 2000, 2100) may further include a dielectric capping layer 316 that is in contact with the phase change material element 306 and that separates the heater pad 314 from the phase change material element 306. The dielectric capping layer 316 may include an electrical insulator having a thermal conductivity greater than 100 W/mK. The dielectric capping layer 316 may include at least one of silicon nitride, silicon carbide, silicon carbide nitride, and aluminum nitride. In some embodiments, the phase change material element 306 may be configured to switch from the conducting phase to the insulating phase within a time that is approximately $5.0 \times 10^{-7}$ sec or less.

According to other embodiments, a further PCM switch (300, 400, 1200, 2000, 2100) is provided. The PCM switch (300, 400, 1200, 2000, 2100) may include a phase change material element 306 having a first electrode 1202*a* and a second electrode 1202*b*; a first conductor 304*a* coupled the first electrode 1202*a*; a second conductor 304*b* coupled to the second electrode 1202*b*; a heating element 310 coupled to a first side of the phase change material element 306 (e.g., see FIGS. 4B, 20, and 21) and configured to supply a heat pulse to the phase change material element; and a heat spreader 318 (e.g., see FIGS. 4B, 20, and 21). The phase change material element 306 may include a phase change material that switches from an electrically conducting phase to an electrically insulating phase by application of the heat pulse by the heating element 310.

The first conductor 304*a*, the second conductor 304*b*, and the phase change material element 306 may be configured to form an RF switch (300, 400, 1200, 2000, 2100) that blocks RF signals when the phase change material element 306 is the electrically insulating phase and conducts RF signals when the when the phase change material element 306 is in the electrically conducting phase. The heat spreader 318 may be formed on a second side of the phase change material element 306 opposite to the heating element 310 (e.g., see FIGS. 4B, 20, and 21). In certain embodiments, the heat spreader 318 may include a metal or a compound semiconductor having a thermal conductivity greater than 100 W/mK. Further, heat spreader 318 may be electrically isolated from the heating element 310 and the phase change material element 306.

Various disclosed embodiments may provide advantages over existing systems and methods by providing PCM switches having improved thermal confinement within the phase change material layer and improved thermal diffusion by including a thermal spreader layer. In this regard, a thermally-conductive dielectric capping layer (e.g., including a high-k dielectric material) located between a heater pad and the phase change material layer of the PCM switch may provide heat to the phase change material layer in a localized region. Further, the presence of a thermal spreader structure may improve removal of thermal energy after switching events. The localized spatial distribution of heat provided to the phase change material may reduce a power required to switch the phase change material. Further, more efficient removal of heat following switching events may increase a switching speed of the PCM switch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase change material (PCM) switch, comprising:
   a phase change material element having a first electrode and a second electrode;
   a heating element coupled to a first side of the phase change material element and configured to supply a heat pulse to the phase change material element; and
   a heat spreader formed on a second side of the phase change material element opposite to the heating element such that the phase change material element is located between the heating element and the heat spreader,
   wherein the heat spreader is separated from the phase change material element by an electrically insulating material, and
   wherein the phase change material element comprises a phase change material that switches from an electrically conducting phase to an electrically insulating phase by application of the heat pulse by the heating element.

2. The PCM switch of claim 1, wherein the heat spreader comprises a metal or a compound semiconductor having a thermal conductivity greater than 100 W/mK, the first electrode and second electrode are on opposing ends of the phase change material in a first direction, and the phase change material element is located between the heating element and the heat spreader in a second direction perpendicular to the first direction.

3. The PCM switch of claim 1, wherein the heat spreader comprises Cu or SiC.

4. The PCM switch of claim 1, wherein the heat spreader is electrically isolated from the heating element and the phase change material element.

5. The PCM switch of claim 1, wherein the electrically insulating material has a thermal conductivity in a range from approximately 0.1 W/mK to approximately 50 W/mK.

6. The PCM switch of claim 1, wherein the phase change material element comprises a material having a thermal conductivity in a range from approximately 2.5 W/mK to approximately 10 W/mK.

7. The PCM switch of claim 1, wherein the phase change material element comprises at least one of a germanium telluride compound, an antimony telluride compound, a germanium antimony telluride compound, a germanium antimony compound, an indium germanium telluride compound, an aluminum selenium telluride compound, an indium selenium telluride compound, and an aluminum indium selenium telluride compound.

8. The PCM switch of claim 1, wherein the heating element comprises a heater pad that generates heat when an applied voltage generates a current through the heater pad.

9. The PCM switch of claim 8, wherein the heater pad comprises at least one of tungsten, tungsten nitride, titanium nitride, and a nickel silicide.

10. The PCM switch of claim 8, wherein the heater pad comprises a material having a thermal conductivity greater than 175 W/mK.

11. The PCM switch of claim 8, wherein the heating element further comprises a dielectric capping layer that is in contact with the phase change material element and that separates the heater pad from the phase change material element.

12. The PCM switch of claim 11, wherein the dielectric capping layer comprises an electrical insulator having a thermal conductivity greater than 100 W/mK.

13. The PCM switch of claim 11, wherein the dielectric capping layer comprises at least one of silicon nitride, silicon carbide, silicon carbide nitride, and aluminum nitride.

14. The PCM switch of claim 1, wherein the phase change material element is configured to switch from the electrically conducting phase to the electrically insulating phase within a time that is approximately $5.0 \times 10^{-7}$ sec or less.

15. A phase change material (PCM) switch, comprising:
a phase change material element having a first electrode and a second electrode;
a first conductor coupled the first electrode;
a second conductor coupled to the second electrode;
a heating element coupled to a first side of the phase change material element and configured to supply a heat pulse to the phase change material element; and
a heat spreader formed on a second side of the phase change material element and is electrically isolated from the heating element and the phase change material element, wherein the phase change material element comprises a phase change material that switches from an electrically conducting phase to an electrically insulating phase by application of the heat pulse by the heating element,
wherein the phase change material element is disposed between the heating element and the heat spreader, and
wherein the first conductor, the second conductor, and the phase change material element, form an RF switch that blocks RF signals when the phase change material element is the electrically insulating phase and conducts RF signals when the when the phase change material element is in the electrically conducting phase.

16. The PCM switch of claim 15, wherein the heat spreader is formed on a second side of the phase change material element opposite to the heating element.

17. The PCM switch of claim 15, wherein the heat spreader comprises a metal or a compound semiconductor having a thermal conductivity greater than 100 W/mK.

18. A method of forming a PCM switch, comprising:
forming a phase change material element;
forming a heating element on a first side of the phase change material element such that the heating element generates and supplies heat to the phase change material element when an applied voltage generates a current through the heating element;
forming a heat spreader on a second side of the phase change material element opposite to the heating element;
forming a first electrode in contact with the phase change material element; and
forming a second electrode in contact with the phase change material element,
wherein the phase change material element comprises a phase change material that switches from an electrically conducting phase to an electrically insulating phase by application of a heat pulse by the heating element,
wherein the phase change material element is disposed between the heating element and the heat spreader, and
wherein the first electrode, the second electrode, the heating element, and the phase change material element, form an RF switch that blocks RF signals when the phase change material element is the electrically insulating phase and conducts RF signals when the when the phase change material element is in the electrically conducting phase.

19. The method of claim 18, wherein forming the heating element further comprises:
forming an electrically conducting heater pad that generates heat when the applied voltage generates the current through the electrically conducting heater pad; and
forming a dielectric capping layer that is in contact with the phase change material element and that separates the electrically conducting heater pad from the phase change material element.

20. The method of claim 18, wherein forming the heat spreader further comprises:
forming an electrically insulating material over the phase change material element; and
forming the heat spreader as a metal or a compound semiconductor over the electrically insulating material such that the heat spreader is electrically isolated from the phase change material element and the heating element.

* * * * *